United States Patent
Jin et al.

(10) Patent No.: US 12,027,482 B2
(45) Date of Patent: Jul. 2, 2024

(54) SEMICONDUCTOR CHIP HAVING A THROUGH ELECTRODE AND SEMICONDUCTOR PACKAGE INCLUDING THE SEMICONDUCTOR CHIP

(71) Applicant: SAMSUNG ELECTRONICS CO., LTD., Suwon-si (KR)

(72) Inventors: Jeonggi Jin, Seoul (KR); Gyuho Kang, Cheonan-si (KR); Unbyoung Kang, Hwaseong-si (KR); Heewon Kim, Asan-si (KR); Jumyong Park, Cheonan-si (KR); Hyunsu Hwang, Siheung-si (KR)

(73) Assignee: Samsung Electronics Co., Ltd. (KR)

( * ) Notice: Subject to any disclaimer, the term of this patent is extended or adjusted under 35 U.S.C. 154(b) by 227 days.

(21) Appl. No.: 17/568,355

(22) Filed: Jan. 4, 2022

(65) Prior Publication Data
US 2023/0010936 A1  Jan. 12, 2023

(30) Foreign Application Priority Data

Jul. 8, 2021 (KR) .................. 10-2021-0089938

(51) Int. Cl.
*H01L 23/00* (2006.01)
*H01L 23/48* (2006.01)
*H01L 23/522* (2006.01)
*H01L 23/532* (2006.01)

(52) U.S. Cl.
CPC ............ *H01L 24/08* (2013.01); *H01L 23/481* (2013.01); *H01L 23/5226* (2013.01); *H01L 23/53238* (2013.01); *H01L 24/05* (2013.01); *H01L 2224/02251* (2013.01); *H01L 2224/05009* (2013.01); *H01L 2224/05555* (2013.01); *H01L 2224/05647* (2013.01); *H01L 2224/08146* (2013.01)

(58) Field of Classification Search
CPC ............... H01L 23/481; H01L 23/5226; H01L 2224/05009; H01L 21/76898; H01L 2224/24135; H01L 2224/244
See application file for complete search history.

(56) References Cited

U.S. PATENT DOCUMENTS

| | | | |
|---|---|---|---|
| 8,390,120 B2 | 3/2013 | Moon et al. | |
| 8,519,516 B1 | 8/2013 | Gandhi | |
| 8,809,123 B2 | 8/2014 | Liu et al. | |
| 8,970,011 B2 | 3/2015 | Farooq et al. | |
| 9,076,849 B2* | 7/2015 | An | H01L 21/76885 |
| 9,111,821 B2 | 8/2015 | Lin et al. | |
| 10,546,801 B2 | 1/2020 | Li et al. | |

(Continued)

FOREIGN PATENT DOCUMENTS

| | | | | |
|---|---|---|---|---|
| CN | 108091564 A | * | 5/2018 | ....... H01L 21/30604 |
| DE | 102011000926 A1 | * | 7/2012 | ......... H01L 21/6835 |

*Primary Examiner* — Mamadou L Diallo
(74) *Attorney, Agent, or Firm* — Fish & Richardson P.C.

(57) ABSTRACT

A semiconductor chip includes: a semiconductor substrate; a pad insulating layer on the semiconductor substrate; a through electrode which penetrates the semiconductor substrate and the pad insulating layer and includes a conductive plug and a conductive barrier layer surrounding a sidewall of the conductive plug; and a bonding pad which surrounds a sidewall of the through electrode and is spaced apart from the conductive plug with the conductive barrier layer disposed therebetween.

19 Claims, 19 Drawing Sheets

(56) References Cited

U.S. PATENT DOCUMENTS

| | | |
|---|---|---|
| 10,840,190 B1 | 11/2020 | Yang et al. |
| 11,728,247 B2* | 8/2023 | Hu .......................... H01L 24/11 |
| | | 257/774 |
| 2014/0008815 A1* | 1/2014 | Park .................. H01L 21/76898 |
| | | 257/774 |
| 2017/0025384 A1* | 1/2017 | Park ...................... H01L 23/481 |
| 2020/0006288 A1 | 1/2020 | Chen et al. |
| 2021/0183820 A1* | 6/2021 | Chang ............... H01L 21/76898 |
| 2022/0293580 A1* | 9/2022 | Park .................... H01L 23/3135 |
| 2023/0120361 A1* | 4/2023 | Lee ...................... H01L 23/481 |
| | | 257/751 |
| 2023/0140683 A1* | 5/2023 | Chang .................... H01L 24/03 |
| | | 257/774 |

\* cited by examiner

SEMICONDUCTOR CHIP HAVING A THROUGH ELECTRODE AND SEMICONDUCTOR PACKAGE INCLUDING THE SEMICONDUCTOR CHIP

CROSS-REFERENCE TO RELATED APPLICATION

This application is based on and claims priority under 35 U.S.C. § 119 to Korean Patent Application No. 10-2021-0089938, filed on Jul. 8, 2021, in the Korean Intellectual Property Office, the disclosure of which is incorporated by reference herein in its entirety.

BACKGROUND

The inventive concept relates to a semiconductor chip and a semiconductor package including stacked semiconductor chips.

To meet the need for miniaturized, multifunctional, and high-performance electronic products, semiconductor packages are needed that are highly integrated and have high operational speed. Accordingly, semiconductor packages having a plurality of stacked semiconductor chips are being developed.

SUMMARY

The inventive concept disclosed provides a semiconductor chip and a semiconductor package including stacked semiconductor chips.

According to another aspect of the inventive concept, there is provided a semiconductor chip including: a semiconductor substrate; a pad insulating layer on the semiconductor substrate; a through electrode which penetrates the semiconductor substrate and a pad insulating layer that includes a conductive plug and a conductive barrier layer surrounding a sidewall of the conductive plug; a bonding pad which surrounds a sidewall of a through electrode and is spaced apart from the conductive plug with a conductive barrier layer disposed therebetween.

According to another aspect of the inventive concept, there is provided a semiconductor chip including: a semiconductor substrate including a first surface and a second surface, which are opposite to each other; a pad insulating layer over the first surface of the semiconductor substrate; a through electrode which penetrates the semiconductor substrate and a pad insulating layer and includes a conductive plug and a conductive barrier layer surrounding a sidewall of the conductive plug; a ring-shaped bonding pad which is provided in a recess of the pad insulating layer and surrounds a sidewall of the through electrode; and a wiring structure including a wiring insulating layer on the second surface of the semiconductor substrate, and a conductive wiring pattern which is provided in the wiring insulating layer and is electrically connected to the through electrode, wherein the bonding pad includes: a conductive core layer provided in the recess of the pad insulating layer; and a conductive seed layer provided between a surface of the pad insulating layer defining the recess and the conductive core layer and between the conductive core layer and the conductive barrier layer.

According to another aspect of the inventive concept, there is provided a semiconductor package including a first semiconductor chip and a second semiconductor chip bonded to each other, wherein the first semiconductor chip includes: a first semiconductor substrate including a first surface and a second surface, which are opposite to each other; a first pad insulating layer on the first surface of the first semiconductor substrate; a first through electrode including a first conductive plug penetrating the first semiconductor substrate and the first pad insulating layer, and a first conductive barrier layer surrounding a sidewall of the first conductive plug; and a first bonding pad which surrounds a sidewall of the first through electrode and is spaced apart from the first conductive plug with the first conductive barrier layer therebetween, and the second semiconductor chip includes a second semiconductor substrate, and a second bonding pad which is in contact with at least one of the first bonding pad and the first through electrode.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1:
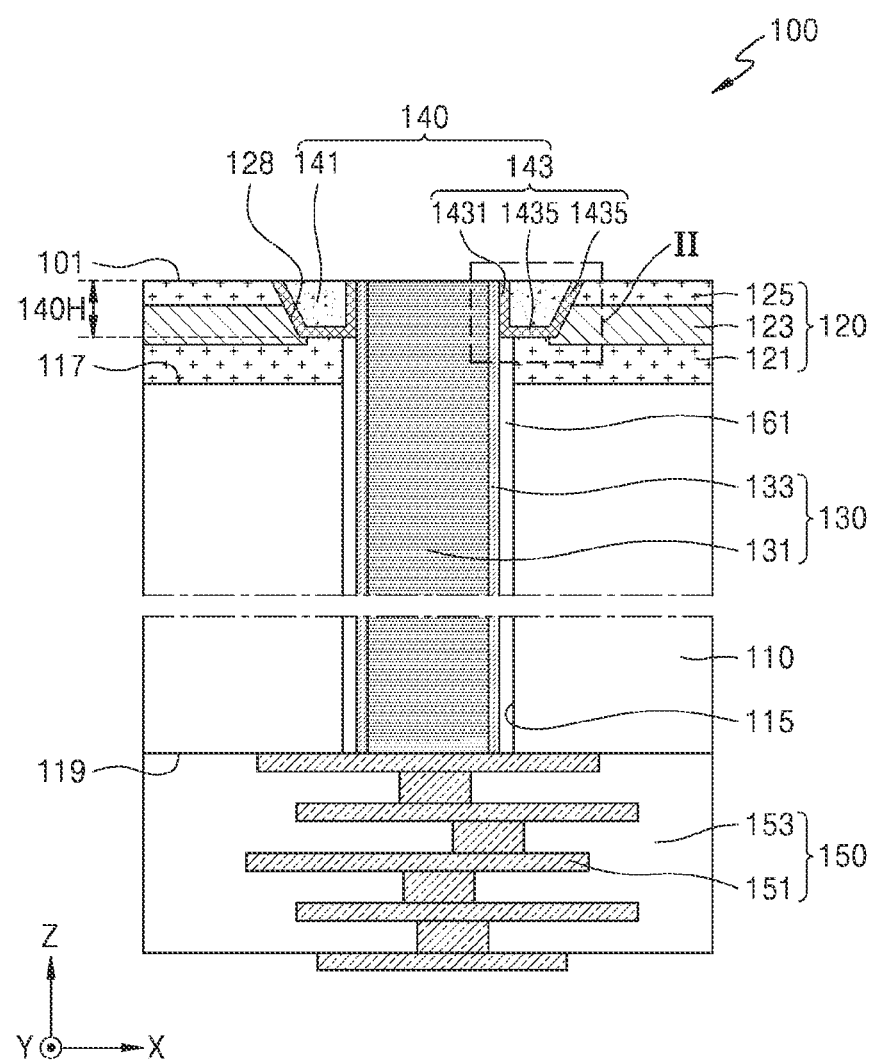
FIG. 1 is a cross-sectional view schematically illustrating a semiconductor chip according to exemplary embodiments of the inventive concept.

Hereinafter, embodiments of the inventive concept will be described in detail with reference to the accompanying drawings. The same reference numerals are used for the same components in the drawings, and duplicate descriptions thereof will be omitted.

Figure 2:
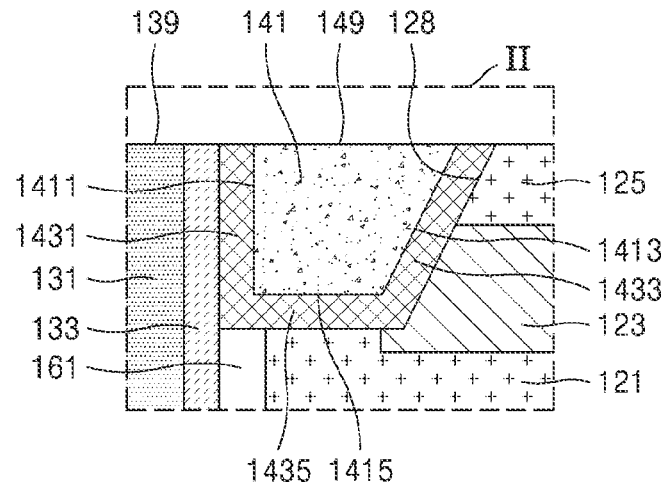
FIG. 2 is an enlarged view illustrating a region "II" in FIG. 1.
Figure 3:
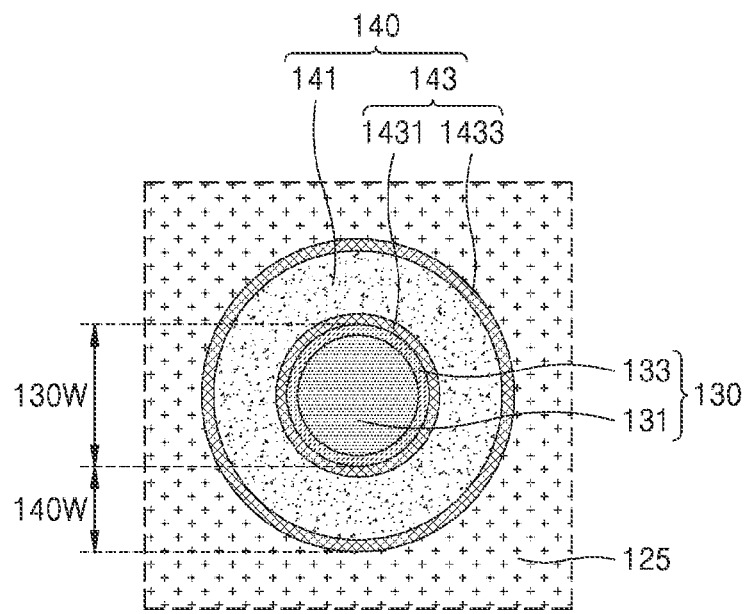
FIG. 3 is a plan view of the semiconductor chip of FIG. 1.
Figure 3:
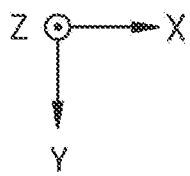

FIG. 1 is a cross-sectional view schematically illustrating a semiconductor chip 100 according to exemplary embodiments of the inventive concept. FIG. 2 is an enlarged view illustrating a region "II" in FIG. 1. FIG. 3 is a plan view of the semiconductor chip 100 of FIG. 1.

Referring to FIGS. 1 to 3, the semiconductor chip 100 may include a semiconductor substrate 110, a pad insulating layer 120, a through electrode 130, a bonding pad 140, and a wiring structure 150.

The semiconductor substrate 110 may include a first surface 117 and a second surface 119, which are opposite to each other. The first surface 117 of the semiconductor substrate 110 may be a backside surface of the semiconductor substrate 110, and the second surface 119 of the semiconductor substrate 110 may be a front-side surface of the semiconductor substrate 110. The first surface 117 of the semiconductor substrate 110 may be an inactive surface of the semiconductor substrate 110, and the second surface 119 of the semiconductor substrate 110 may be an active surface of the semiconductor substrate 110.

Hereinafter, a direction parallel to the first surface 117 of the semiconductor substrate 110 is defined as a horizontal direction (e.g., an X direction and/or a Y direction), and a direction perpendicular to the first surface 117 of the semiconductor substrate 110 is defined as a vertical direction (e.g., a Z direction). In addition, a horizontal width of any component refers to a length along the horizontal direction (e.g., the X direction and/or the Y direction), and a vertical height of any component refers to a length along the vertical direction (e.g., the Z direction).

The semiconductor substrate 110 may be formed from a semiconductor wafer. The semiconductor substrate 110 may include, for example, silicon (Si). Alternatively, the semiconductor substrate 110 may include a semiconductor element such as germanium (Ge), or a compound semiconductor such as silicon carbide (SiC), gallium arsenide (GaAs), indium arsenide (InAs), and indium phosphide (InP). The semiconductor substrate 110 may include a conductive region, for example, a well doped with impurities or a structure doped with impurities. In addition, the semiconductor substrate 110 may have various device isolation structures, such as a shallow trench isolation (STI) structure.

The pad insulating layer 120 may be provided on the first surface 117 of the semiconductor substrate 110. The pad insulating layer 120 may cover the first surface 117 of the semiconductor substrate 110. In addition, the pad insulating layer 120 may surround the sidewall of the through electrode 130 protruding from the first surface 117 of the semiconductor substrate 110. Also, the pad insulating layer 120 may include a recess 128 in which the bonding pad 140 is embedded. In exemplary embodiments, in a plan view, the recess 128 may be a ring-shaped space continuously extending along the circumference of the through electrode 130. The pad insulating layer 120 may cover a portion of the bonding pad 140 provided in the recess 128.

In exemplary embodiments, the pad insulating layer 120 may include oxide and/or nitride. For example, the pad insulating layer 120 may include at least one of SiO, SiN, SiCN, SiCO, and a polymer material. For example, the polymer material may be benzocyclobutene (BCB), polyimide (PI), polybenzoxazole (PBO), silicone, or epoxy.

In exemplary embodiments, the pad insulating layer 120 may include a first insulating layer 121, a second insulating layer 123, and a third insulating layer 125 that are sequentially stacked on the first surface 117 of the semiconductor substrate 110. In exemplary embodiments, the first insulating layer 121 may include silicon oxide, the second insulating layer 123 may include silicon nitride, and the third insulating layer 125 may include silicon oxide.

The through electrode 130 may penetrate the semiconductor substrate 110 and the pad insulating layer 120. The through electrode 130 may be provided in a through hole 115 of the semiconductor substrate 110 extending from the second surface 119 to the first surface 117 of the semiconductor substrate 110. In addition, the through electrode 130 may protrude from the first surface 117 of the semiconductor substrate 110, and extend from the lower surface of the pad insulating layer 120 to the upper surface of the pad insulating layer 120 to penetrate the pad insulating layer 120.

An upper surface 139 of the through electrode 130 may be exposed to the outside. In exemplary embodiments, a horizontal width (or a diameter) 130 W of the upper surface 139 of the through electrode 130 may be between about 10 μm and about 100 μm.

The through electrode 130 may include a conductive plug 131 and a conductive barrier layer 133 on the outer surface of the conductive plug 131. The conductive plug 131 may have a shape of a column extending so as to penetrate the semiconductor substrate 110 and the pad insulating layer 120. The conductive barrier layer 133 may surround the sidewall of the conductive plug 131. The conductive barrier layer 133 may have a cylindrical shape surrounding the sidewall of the conductive plug 131. The conductive barrier layer 133 may extend from the lower end to the upper end of the sidewall of the conductive plug 131, and cover the entire sidewall of the conductive plug 131. For example, the conductive plug 131 may include at least one material selected from copper (Cu), nickel (Ni), gold (Au), silver (Ag), tungsten (W), titanium (Ti), tantalum (Ta), indium (In), molybdenum (Mo), manganese (Mn), cobalt (Co), tin (Sn), magnesium (Mg), rhenium (Re), beryllium (Be), gallium (Ga), and ruthenium (Ru). The conductive barrier layer 133 may include at least one material selected from titanium (Ti), titanium nitride (TiN), tantalum (Ta), tantalum nitride (TaN), tungsten (W), tungsten nitride (WN), ruthenium (Ru), and cobalt (Co). The conductive plug 131 and the conductive barrier layer 133 may be formed by, for example, physical vapor deposition (PVD), chemical vapor deposition (CVD), and/or plating.

A via insulating layer 161 may be disposed between the semiconductor substrate 110 and the through electrode 130. The via insulating layer 161 may extend from the second surface 119 to the first surface 117 of the semiconductor substrate 110, and surround the side wall of the through electrode 130 in the through hole 115 of the semiconductor substrate 110. In exemplary embodiments, the via insulating layer 161 may protrude from the first surface 117 of the semiconductor substrate 110, and surround a portion of the through electrode 130 protruding from the first surface 117 of the semiconductor substrate 110. A portion of the via insulating layer 161 may extend upward along the sidewall of the through electrode 130 from the first surface 117 of the semiconductor substrate 110 to a lower portion of the pad insulating layer 120. The via insulating layer 161 may include an oxide. For example, the via insulating layer 161 may include ozone/tetra-ethyl ortho-silicate (O₃/TEOS)-based high-aspect-ratio process (HARP) oxide formed by low-pressure chemical vapor deposition (CVD) (sub-atmospheric CVD).

The bonding pad 140 may be disposed in the recess 128 of the pad insulating layer 120 and may be in contact with the through electrode 130. The bonding pad 140 may have a ring shape extending along the circumference of the through electrode 13, in a plan view. The bonding pad 140 may extend radially from the edge of the through electrode 130. In addition, the bonding pad 140 may extend from the upper end of the sidewall of the through electrode 130 toward the lower end of the sidewall of the through electrode 130 along the conductive barrier layer 133, which constitutes the sidewall of the through electrode 130. In exemplary embodiments, the bonding pad 140 may extend from the upper end of the sidewall of the through electrode 130 to the upper end of the via insulating layer 161. The bonding pad 140 may be in contact with the upper end of the via insulating layer 161.

In exemplary embodiments, a vertical height 140H of the bonding pad 140 may be between about 1 μm and about 10 μm. In other words, the length of the bonding pad 140 extending downward along the sidewall of the through electrode 130 from the upper end of the sidewall of the through electrode 130 may be between about 1 μm and about 10 μm.

The bonding pad 140 may be in contact with the conductive barrier layer 133, and may be spaced apart from the conductive plug 131 with the conductive barrier layer 133 disposed therebetween. The bonding pad 140 may be in contact with the sidewall of the conductive barrier layer 133 and extend along the sidewall of the conductive barrier layer 133.

In exemplary embodiments, the bonding pad 140 may include a conductive core layer 141 and a conductive seed layer 143. The conductive seed layer 143 may be formed to partially cover the surface of the conductive core layer 141. For example, the conductive seed layer 143 may cover portions of the surface of the conductive core layer 141 except for the upper surface of the conductive core layer 141. In exemplary embodiments, the conductive core layer 141 may be formed by performing electroplating using the conductive seed layer 143 as a seed.

An upper surface 149 of the bonding pad 140 may be exposed to the outside. As illustrated in FIG. 3, the upper surface 149 of the bonding pad 140 may have a ring shape surrounding the upper surface 139 of the through electrode 130. In exemplary embodiments, a horizontal width 140 W of the upper surface 149 of the bonding pad 140 (i.e., the distance between the inner circumference and the outer circumference of the upper surface 149 of the bonding pad 140) may be 0.5 to 10 times, or 1 and 5 times the horizontal width 130 W of the upper surface 139 of the through electrode 130. In exemplary embodiments, the horizontal width 140 W of the upper surface 149 of the bonding pad 140 may be between about 5 μm and about 1000 μm.

The conductive seed layer 143 may be provided between the surface of the pad insulating layer 120, which defines the recess 128 of the pad insulating layer 120 and the conductive core layer 141, and between the conductive barrier layer 133 and the conductive core layer 141. In exemplary embodiments, the conductive seed layer 143 may include a first portion 1431 covering an inner circumferential surface 1411 of the conductive core layer 141 facing the sidewall of the through electrode 130, a second portion 1433 covering an outer circumferential surface 1413 of the conductive core layer 141 facing the pad insulating layer 120, and a third portion 1435 covering a bottom surface 1415 of the conductive core layer 141 facing the pad insulating layer 120. The first portion 1431 of the conductive seed layer 143 may extend along the inner circumferential surface 1411 of the conductive core layer 141 and the conductive barrier layer 133, and may be between the inner circumferential surface 1411 of the conductive core layer 141 and the conductive barrier layer 133. In exemplary embodiments, the conductive core layer 141 may be spaced apart from the conductive barrier layer 133 with the first portion 1431 of the conductive seed layer 143 disposed therebetween. The second portion 1433 of the conductive seed layer 143 may extend along the outer circumferential surface 1413 of the conductive core layer 141, and may be disposed between the outer circumferential surface 1413 of the conductive core layer 141 and the surface of the pad insulating layer 120, which defines the recess 128. The third portion 1435 of the conductive seed layer 143 may extend along the bottom surface 1415 of the conductive core layer 141, and may be disposed between the bottom surface 1415 of the conductive core layer 141 and the surface of the pad insulating layer 120, which defines the recess 128.

For example, the conductive core layer 141 may include at least one material selected from copper (Cu), nickel (Ni), gold (Au), silver (Ag), tungsten (W), titanium (Ti), tantalum (Ta), indium (In), molybdenum (Mo), manganese (Mn), cobalt (Co), tin (Sn), magnesium (Mg), rhenium (Re), beryllium (Be), gallium (Ga), and ruthenium (Ru).

For example, the conductive seed layer 143 may include chromium (Cr), tungsten (W), titanium (Ti), copper (Cu), nickel (Ni), aluminum (Al), palladium (Pd), gold (Au), or any combination thereof. In exemplary embodiments, the conductive seed layer 143 may have a structure in which a Ti layer, a TiW layer, and a Cu layer are stacked.

In exemplary embodiments, the grain size of the conductive plug 131 of the through electrode 130 may be larger than the grain size of the conductive core layer 141 of the bonding pad 140. For example, the grain size of a metal included in the conductive plug 131 may be larger than the grain size of a metal included in the conductive core layer 141. For example, the conductive plug 131 of the through electrode 130 may be formed by performing heat treatment with a temperature higher than that involved in formation of the conductive core layer 141 of the bonding pad 140. For example, the conductive plug 131 of the through electrode 130 may be formed by performing heat treatment with a high temperature of about 300 ☐ (Celsius temperature), and thus the metal included in the through electrode 130 may have a relatively large grain size.

In exemplary embodiments, the upper surface 149 of the bonding pad 140 and the upper surface 139 of the through electrode 130 may be exposed to the outside, and may be connected to each other. In exemplary embodiments, the upper surface 149 of the bonding pad 140 and the upper surface 139 of the through electrode 130 may be substantially coplanar with each other. In addition, the upper surface of the pad insulating layer 120 may be exposed to the outside, and may be substantially coplanar with the upper surface 149 of the bonding pad 140 and the upper surface 139 of the through electrode 130. The upper surface 149 of the bonding pad 140, the upper surface 139 of the through electrode 130, and the upper surface of the pad insulating layer 120 may constitute a bonding surface 101 of the semiconductor chip 100.

The wiring structure 150 may be on the second surface 119 of the semiconductor substrate 110. The wiring structure 150 may include a back-end-of-line (BEOL) structure formed on a semiconductor device layer provided on the second surface 119 of the semiconductor substrate 110. The wiring structure 150 may include a wiring insulating layer 153 provided on the second surface 119 of the semiconductor substrate 110, and a conductive wiring pattern 151 provided in the wiring insulating layer 153. The conductive wiring pattern 151 of the wiring structure 150 may be electrically connected to the through electrode 130. Also, the wiring structure 150 may be electrically connected to individual devices included in the semiconductor device layer.

The conductive wiring pattern 151 of the wiring structure 150 may include a plurality of wiring lines and a plurality of wiring vias. The plurality of wiring lines and the plurality of wiring vias may be covered by the wiring insulating layer 153. Each of the plurality of wiring lines may extend in the horizontal direction (e.g., the X direction and/or the Y direction) within the wiring insulating layer 153. The plurality of wiring lines may be positioned at different levels in the vertical direction (e.g., the Z direction) within the wiring insulating layer 153 to form a multi-layer wiring structure. The plurality of wiring vias may extend between the plurality of wiring lines positioned at different vertical levels to electrically connect the plurality of wiring lines positioned at the different vertical levels to each other.

For example, the plurality of wiring lines, the plurality of wiring vias, and a conductive contact plug may include a metal such as copper (Cu), aluminum (Al), tungsten (W), titanium (Ti), tantalum (Ta), indium (In), molybdenum (Mo), manganese (Mn), cobalt (Co), tin (Sn), nickel (Ni), magnesium (Mg), rhenium (Re), beryllium (Be), gallium (Ga), ruthenium (Ru), or the like, or an alloy thereof.

In exemplary embodiments, the wiring insulating layer 153 may include oxide and/or nitride. For example, the wiring insulating layer 153 may include silicon oxide and/or silicon nitride. In exemplary embodiments, the wiring insulating layer 153 may include an insulating material made of a photo-imagable dielectric (PID) material capable of being processed by a photolithography process. For example, the wiring insulating layer 153 may also include photosensitive polyimide (PSPI).

FIGS. 4A to 4G are cross-sectional views illustrating a method of fabricating the semiconductor chip 100, according to exemplary embodiments of the inventive concept. Hereinafter, the method of fabricating the semiconductor chip 100 illustrated in FIGS. 1 to 3 will be described with reference to FIGS. 4A to 4G.

Figure 4A:
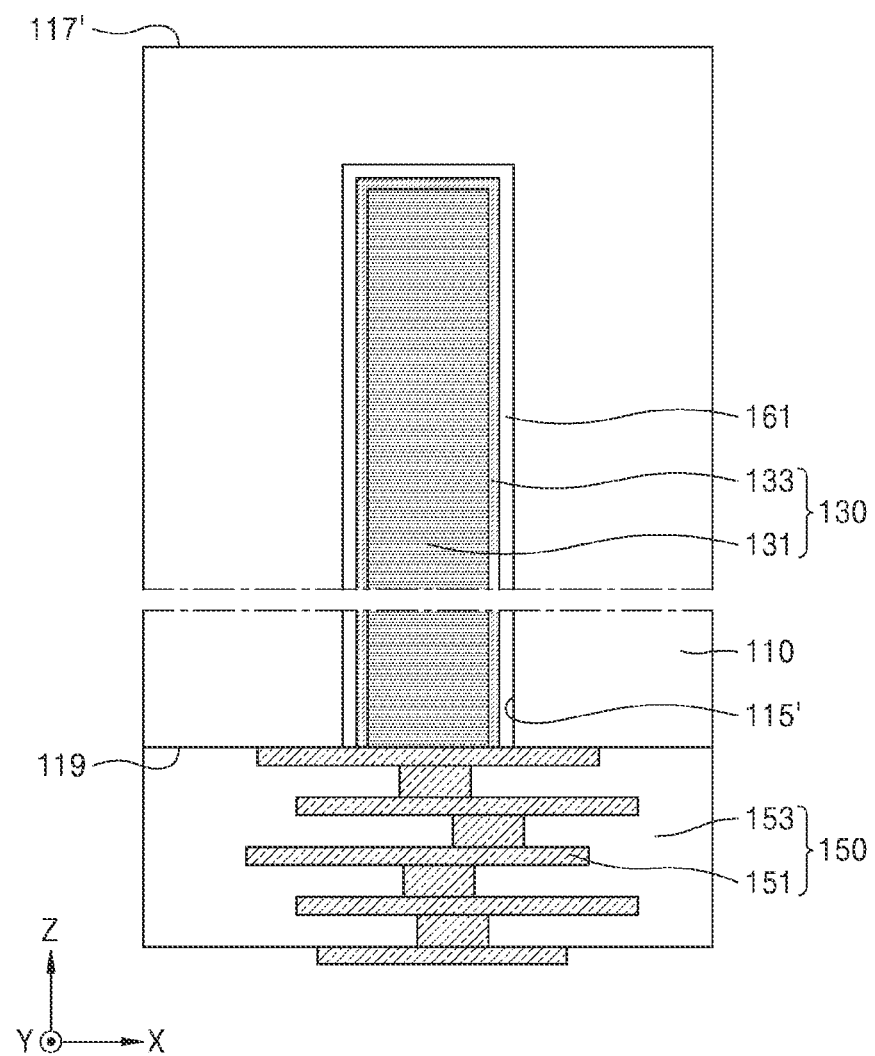
FIGS. 4A to 4G are cross-sectional views illustrating a method of fabricating a semiconductor chip, according to exemplary embodiments of the inventive concept.

Referring to FIG. 4A, the semiconductor substrate 110 including a first surface 117' and the second surface 119, which are opposite to each other, is prepared. The semiconductor substrate 110 may be, for example, a semiconductor wafer. Then, a hole 115' partially penetrating the semiconductor substrate 110 is formed. The hole 115' may extend from the second surface 119 of the semiconductor substrate 110 toward the first surface 117' thereof. After forming the hole 115' in the semiconductor substrate 110, the via insulating layer 161, the conductive barrier layer 133, and the conductive plug 131 may be sequentially formed on the sidewall of the semiconductor substrate 110, which defines the hole 115' of the semiconductor substrate 110. The conductive barrier layer 133 and the conductive plug 131 may form the through electrode 130. After forming the via insulating layer 161 and the through electrode 130, the wiring structure 150 is formed on the second surface 119 of the semiconductor substrate 110. The wiring structure 150 may be formed by using, for example, a damascene process.

Figure 4B:
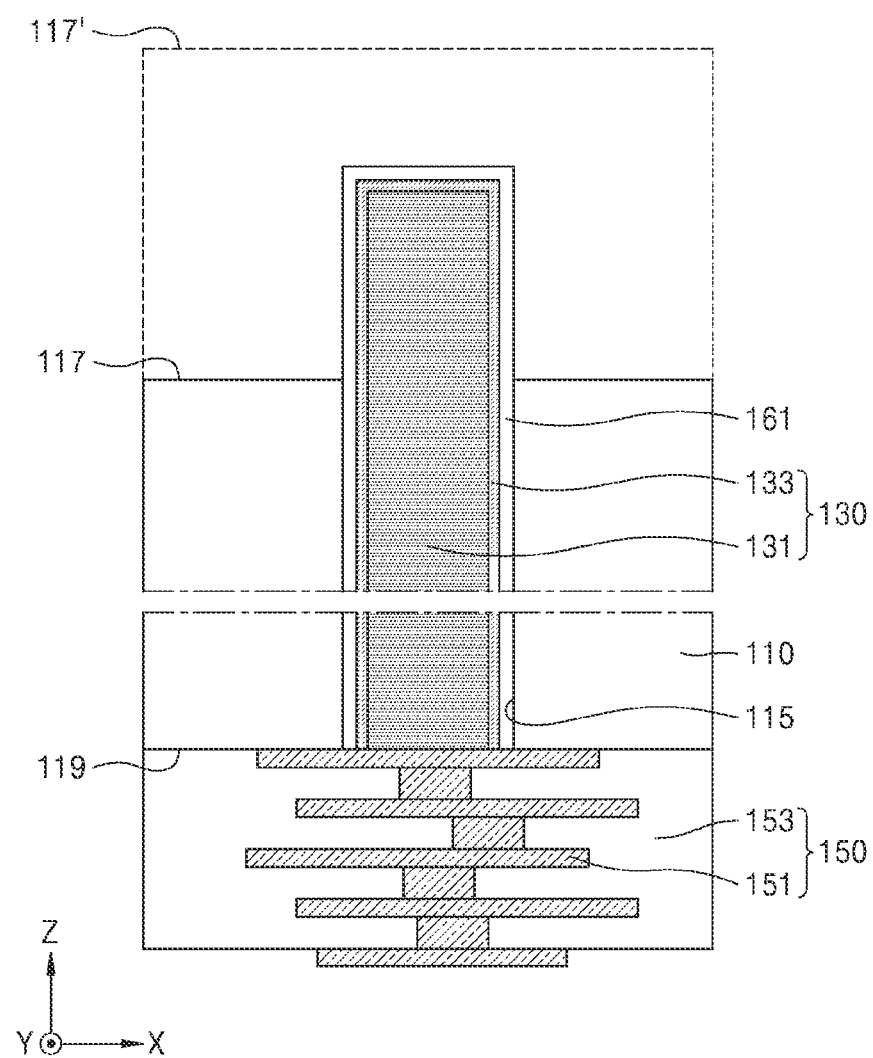

Referring to FIG. 4B, a portion of the semiconductor substrate 110 may be removed to expose a portion of the through electrode 130. As a result of removing a portion of the semiconductor substrate 110, the through electrode 130 may have a shape penetrating the semiconductor substrate 110 and may protrude from the first surface 117 of the semiconductor substrate 110. In order to expose the through electrode 130, the portion of the semiconductor substrate 110 may be removed by using a chemical mechanical polishing (CMP) process, an etch-back process, or any combination thereof.

Figure 4C:
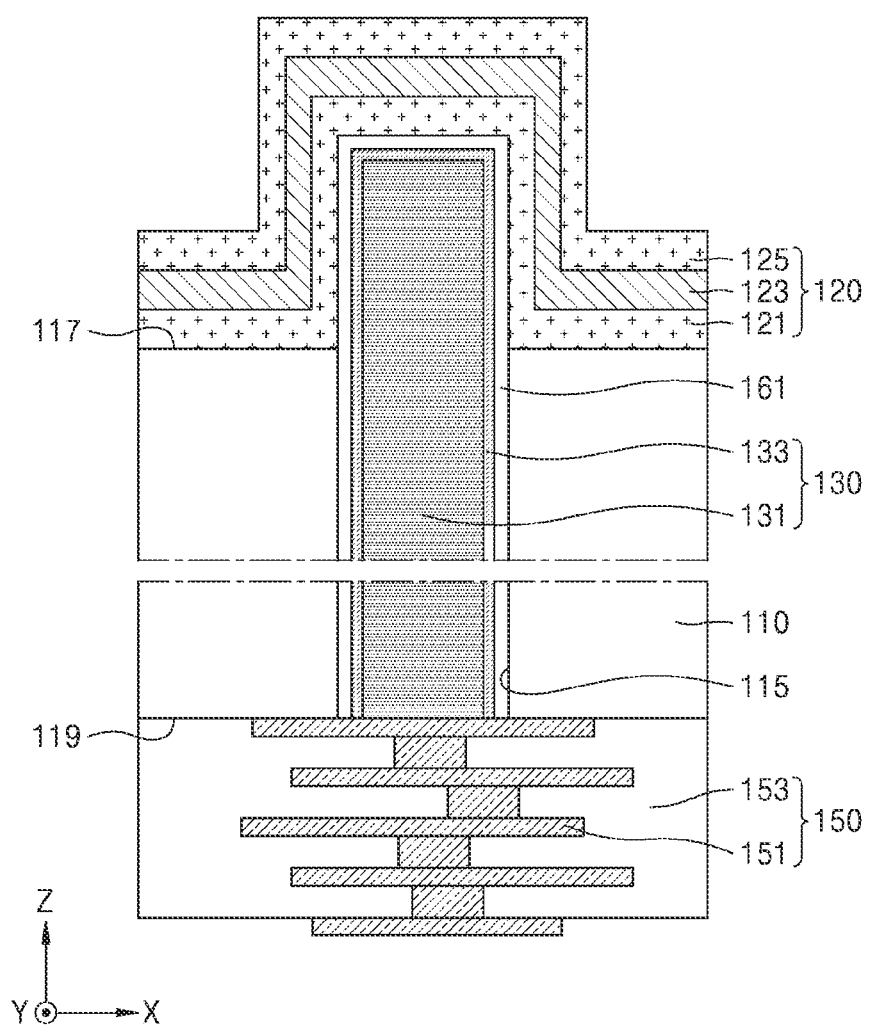

Referring to FIG. 4C, the pad insulating layer 120 is formed on the first surface 117 of the semiconductor substrate 110. In exemplary embodiments, the first insulating layer 121, the second insulating layer 123, and the third insulating layer 125 may be sequentially formed on the first surface 117 of the semiconductor substrate 110. The first insulating layer 121 may be formed to cover the first surface 117 of the semiconductor substrate 110 and the portion of the through electrode 130 protruding from the first surface 117 of the semiconductor substrate 110. The second insulating layer 123 may be formed to cover the first insulating layer 121, and the third insulating layer 125 may be formed to cover the second insulating layer 123. In exemplary embodiments, the first insulating layer 121 and the third insulating layer 125 may include silicon oxide, and the second insulating layer 123 may include silicon nitride.

Figure 4D:
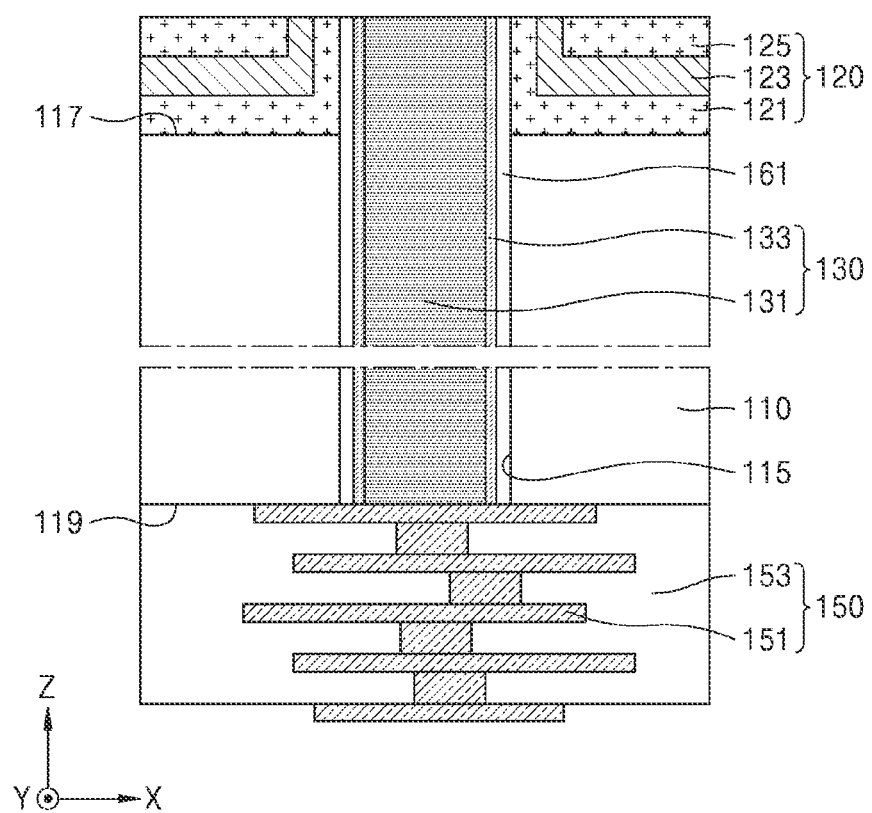

Referring to FIG. 4D, after forming the pad insulating layer 120, a polishing process may be performed on the resultant product of FIG. 4C to expose the through electrode 130. For example, a portion of the pad insulating layer 120, a portion of the via insulating layer 161, a portion of the conductive barrier layer 133, and a portion of the conductive plug 131 may be removed in a polishing process. In exemplary embodiments, the polishing process may include a CMP process.

In exemplary embodiments, the upper surface of the pad insulating layer 120 and the upper surface of the through electrode 130 may be planarized in the polishing process. For example, the upper surface of the pad insulating layer 120 and the upper surface of the through electrode 130 may be substantially coplanar with each other.

Figure 4E:
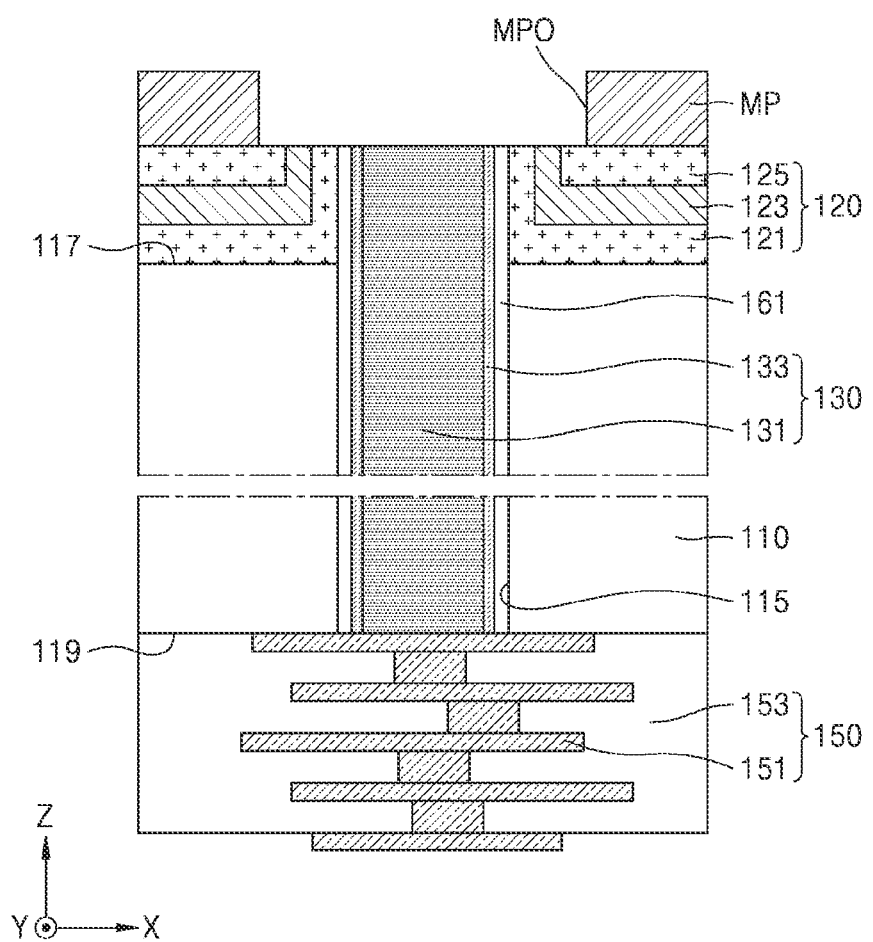

Referring to FIG. 4E, a mask pattern MP including a mask opening MPO is formed on the pad insulating layer 120. Through the mask opening MPO of the mask pattern MP, the upper surface of the through electrode 130 and a portion of the upper surface of the pad insulating layer 120 surrounding the upper surface of the through electrode 130 may be exposed. The mask pattern MP may have a structure in which a photoresist layer including a photoresist material is stacked on a hard disk layer including a carbon-containing material such as a spin-on-carbon (SOC) hard mask material.

Figure 4F:
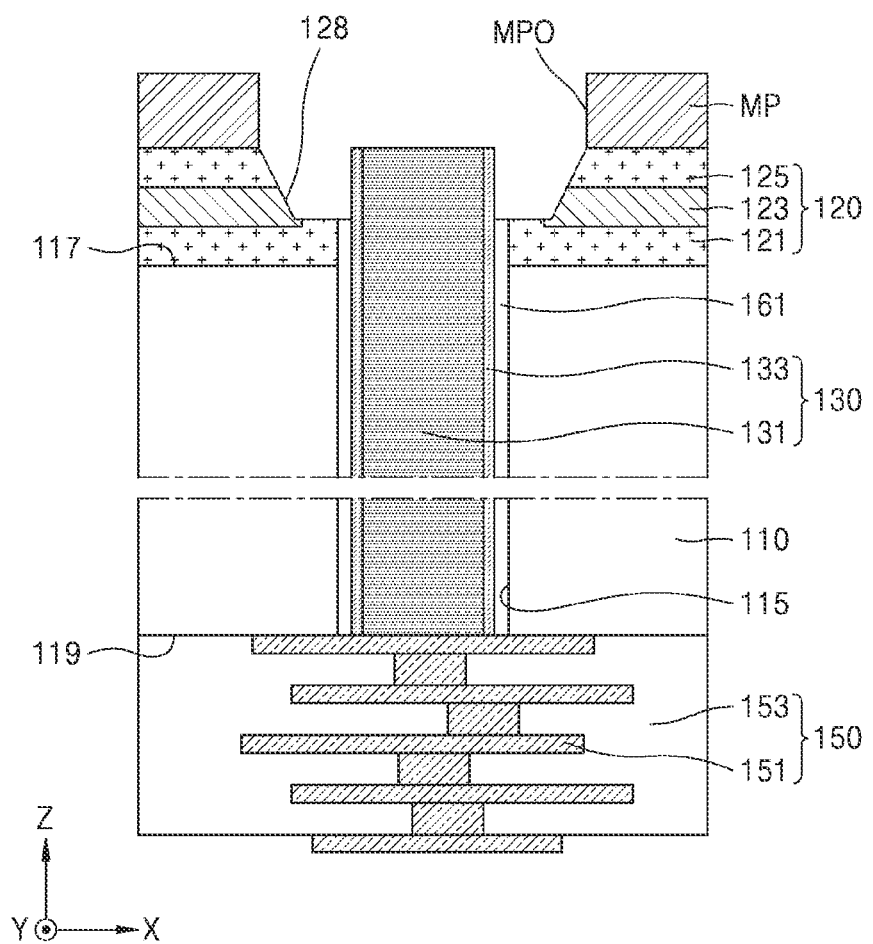

Referring to FIG. 4F, an etching process for removing a portion of the pad insulating layer 120 and a portion of the via insulating layer 161 may be performed by using the mask pattern MP as an etching mask. As the portion of the pad insulating layer 120 is removed in the etching process, the recess 128 extending along the circumference of the through electrode 130 may be formed. Also, as the portion of the via insulating layer 161 is removed in the etching process, a portion of the sidewall of the through electrode 130 may be exposed. For example, the etching process for removing the portion of the pad insulating layer 120 and the portion of the via insulating layer 161 may employ a dry etching process.

Figure 4G:
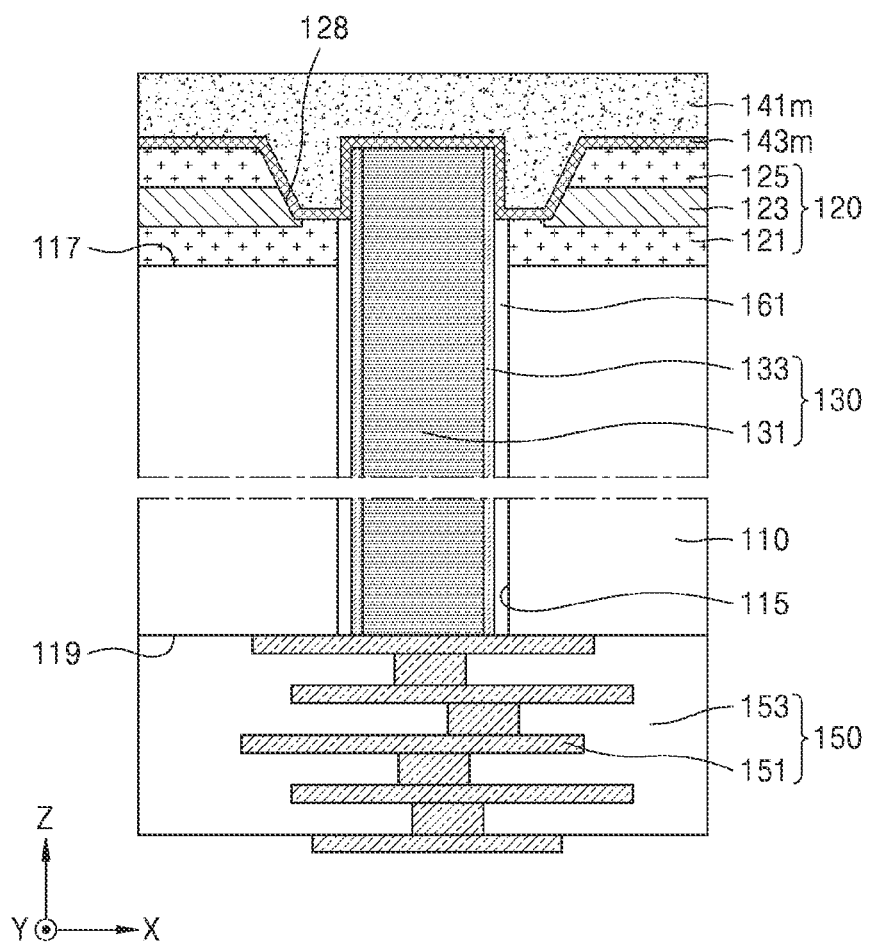

Referring to FIG. 4G, after removing the mask pattern MP from the resultant product of FIG. 4F, a preliminary conductive seed layer 143m and a preliminary conductive core layer 141m are sequentially formed. The preliminary conductive seed layer 143m may be conformally formed along the exposed surface of the pad insulating layer 120 and the exposed surface of the through electrode 130. The preliminary conductive seed layer 143m may be formed by, for example, a PVD process such as sputtering. The preliminary conductive core layer 141m may be formed to cover the preliminary conductive seed layer 143*m*. The preliminary conductive core layer 141*m* may be formed by performing an electroplating process using the preliminary conductive seed layer 143*m* as a seed.

Referring to FIGS. 1 and 2 together with FIG. 4G, after forming the preliminary conductive seed layer 143*m* and the preliminary conductive core layer 141*m*, a portion of the preliminary conductive seed layer 143*m* and a portion of the preliminary conductive core layer 141*m* may be removed such that the through electrode 130 is exposed. For example, the portion of the preliminary conductive seed layer 143*m*, the portion of the preliminary conductive core layer 141*m*, and a portion of the pad insulating layer 120 may be removed by performing a planarization process on the resultant product of FIG. 4G so that the through electrode 130 is exposed. The planarization process may include a CMP process.

The portion of the preliminary conductive seed layer 143*m* and the portion of the preliminary conductive core layer 141*m*, which are outside the recess 128 of the pad insulating layer 120, may be removed in the planarization process. A portion of the preliminary conductive seed layer 143*m* remaining after the planarization process may form the conductive seed layer 143, and a portion of the preliminary conductive core layer 141*m* remaining after the planarization process may form the conductive core layer 141. The conductive seed layer 143 and the conductive core layer 141 may form a bonding pad 140. The bonding pad 140 may be formed to fill the recess 128 of the pad insulating layer 120, and may be in contact with the sidewall of the through electrode 130.

In exemplary embodiments, the upper surface of the pad insulating layer 120, the upper surface of the through electrode 130, and the upper surface 149 of the bonding pad 140 may be planarized through a planarization process. In exemplary embodiments, the upper surface of the pad insulating layer 120, the upper surface of the through electrode 130, and the upper surface 149 of the bonding pad 140 may be substantially coplanar with each other.

In general, a bonding pad is formed on the upper surface of a through electrode. That is, a CMP process for exposing the through electrode is performed, and the bonding pad is formed on the exposed surface of the through electrode. In this case, residues from the CMP process for the through electrode remain on the surface of the through electrode, and, as the bonding pad is formed on the surface of the through electrode on which the residues remain, the interface between the bonding pad and the through electrode may be contaminated. However, according to exemplary embodiments of the inventive concept, the bonding pad 140 has a shape extending outward from the sidewall of the through electrode 130 and is formed such as not to cover the upper surface of the through electrode 130. Accordingly, the issue of contaminants remaining at the interface between the through electrode 130 and the bonding pad 140 is resolved, and thus, the reliability of the connection between the through electrode 130 and the bonding pad 140 may be improved.

In addition, according to exemplary embodiments of the inventive concept, because the through electrode 130 is supported by the bonding pad 140 surrounding the sidewall of the through electrode 130 while the CMP process for exposing the through electrode 130 is in progress, deformation and dishing of the through electrode 130 may be prevented.

Figure 5:
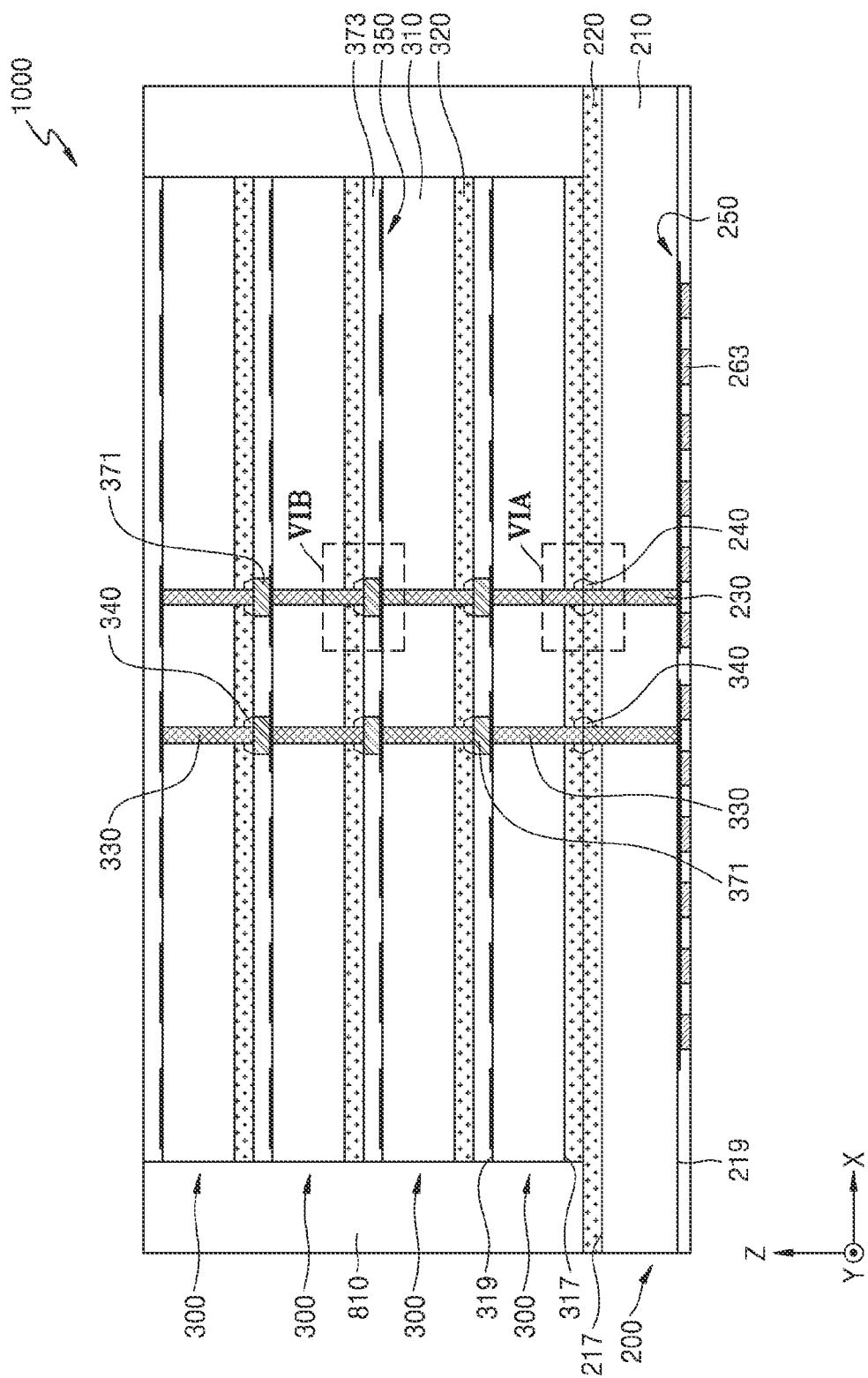
FIG. 5 is a cross-sectional view illustrating a semiconductor package according to exemplary embodiments of the inventive concept.
Figure 6A:
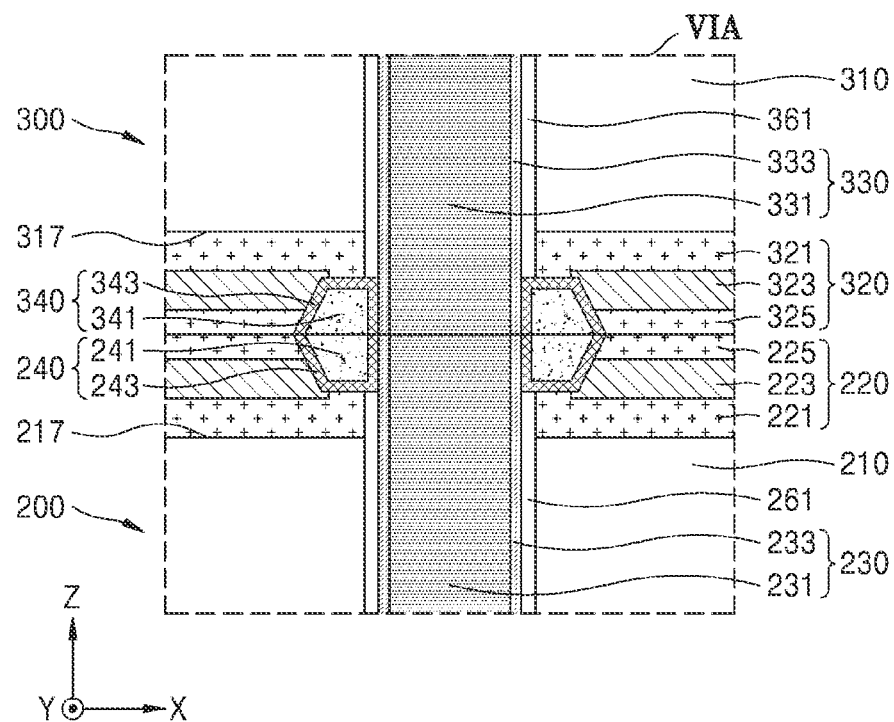
FIG. 6A is an enlarged view illustrating a region "VIA" in FIG. 5.
Figure 6B:
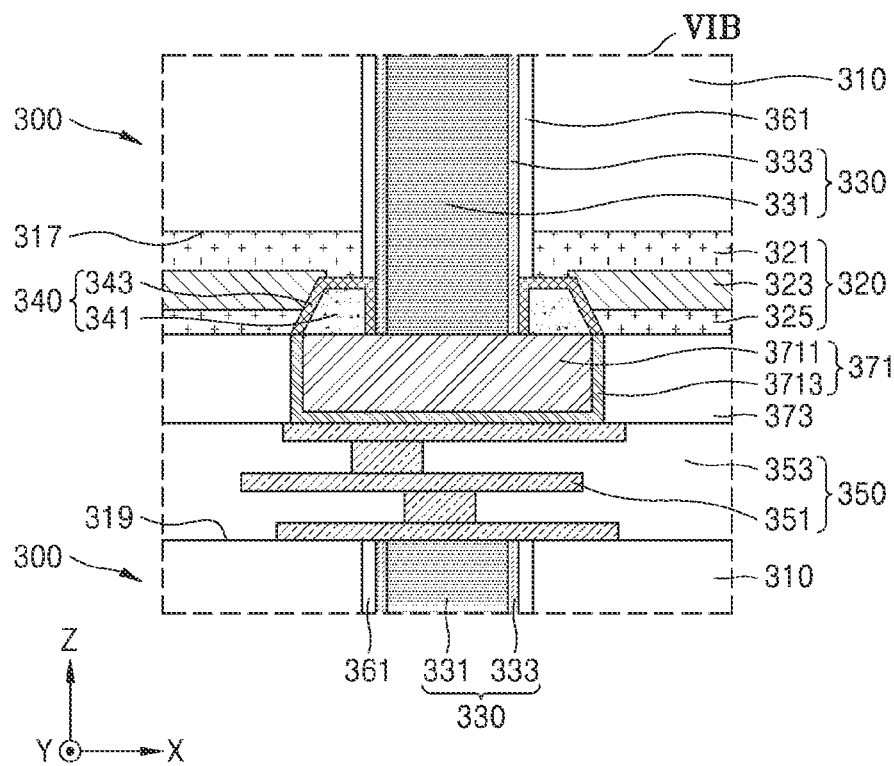
FIG. 6B is an enlarged view illustrating a region "VIB" in FIG. 5.

FIG. 5 is a cross-sectional view illustrating a semiconductor package 1000 (hereinafter, also referred to as the sub-semiconductor package 1000) according to exemplary embodiments of the inventive concept. FIG. 6A is an enlarged view illustrating a region "VIA" in FIG. 5. FIG. 6B is an enlarged view illustrating a region "VIB" in FIG. 5.

Referring to FIGS. 5, 6A, and 6B, the semiconductor package 1000 may include a first semiconductor chip 200 and a plurality of second semiconductor chips 300 (hereinafter, also referred to as the upper, lower, uppermost, and lowermost second semiconductor chips 300). The plurality of second semiconductor chips 300 may be sequentially stacked on the first semiconductor chip 200. Although FIG. 5 illustrates that the semiconductor package 1000 includes four second semiconductor chips 300, the inventive concept is not limited thereto. For example, the semiconductor package 1000 may include two or more second semiconductor chips 300. In exemplary embodiments, the semiconductor package 1000 may include a number of second semiconductor chips 300, wherein the number is a multiple of 4. The plurality of second semiconductor chips 300 may be stacked on the first semiconductor chip 200. The semiconductor package 1000 may be referred to as a sub-semiconductor package.

The first semiconductor chip 200 may be electrically connected to the lowermost second semiconductor chip 300 among the plurality of second semiconductor chips 300, to exchange signals and provide power and ground. Two adjacent second semiconductor chips 300 among the plurality of second semiconductor chips 300 may be electrically connected to each other, to exchange signals and provide or receive power and ground.

The first semiconductor chip 200 may include a first semiconductor substrate 210 having an active surface 219 and an inactive surface 217, which are opposite to each other, a first wiring structure 250 formed on the active surface 219 of the first semiconductor substrate 210, a plurality of first through electrodes 230 connected to the first wiring structure 250 and penetrating at least a portion of the first semiconductor chip 200, a first pad insulating layer 220 formed on the inactive surface 217 of the first semiconductor substrate 210, a plurality of first bonding pads 240 provided in the first pad insulating layer 220 and connected to the plurality of first through electrodes 230, and a first via insulating layer 261. The first through electrode 230 may include a first conductive plug 231 and a first conductive barrier layer 233. The first bonding pad 240 may be provided in a recess of the first pad insulating layer 220, and may include a first conductive core layer 241 and a first conductive seed layer 243. The first pad insulating layer 220 may include first to third insulating layers 221, 223, and 225. The first semiconductor substrate 210 is a component similar to the semiconductor substrate 110 illustrated in FIG. 1, the first wiring structure 250 is a component similar to the wiring structure 150 illustrated in FIG. 1, the first through electrode 230 is a component similar to the through electrode 130 illustrated in FIG. 1, the first pad insulating layer 220 is a component similar to the pad insulating layer 120 illustrated in FIG. 1, the first bonding pad 240 is a component similar to the bonding pad 140 illustrated in FIG. 1, the first via insulating layer 261 is a similar component to the via insulating layer 161 illustrated in FIG. 1, and thus detailed descriptions thereof are omitted as redundant. The first semiconductor chip 200 may further include a plurality of first connection pads 263 connected to the first wiring structure 250. In the semiconductor package 1000, the first semiconductor chip 200 may be arranged such that the active surface 219 of the first semiconductor substrate 210 faces downward and the inactive surface 217 of the first semiconductor substrate 210 faces upward.

The second semiconductor chip 300 may include a second semiconductor substrate 310 having an inactive surface 317 and an active surface 319, which are opposite to each other, a second wiring structure 350 formed on the active surface 319 of the second semiconductor substrate 310, a plurality of second through electrodes 330 connected to the second wiring structure 350 and penetrating at least a portion of the second semiconductor chip 300, a second pad insulating layer 320 formed on the inactive surface 317 of the second semiconductor substrate 310, a plurality of second bonding pads 340 provided in the second pad insulating layer 320 and connected to the plurality of second through electrodes 330, and a second via insulating layer 361. The second through electrode 330 may include a second conductive plug 331 and a second conductive barrier layer 333. The second bonding pad 340 may be provided in a recess of the second pad insulating layer 320, and may include a second conductive core layer 341 and a second conductive seed layer 343. The second pad insulating layer 320 may include first to third insulating layers 321, 323, and 325. The second semiconductor substrate 310 is a component similar to the semiconductor substrate 110 illustrated in FIG. 1, the second wiring structure 350 is a component similar to the wiring structure 150 illustrated in FIG. 1, the second through electrode 330 is a component similar to the through electrode 130 illustrated in FIG. 1, the second pad insulating layer 320 is a component similar to the pad insulating layer 120 illustrated in FIG. 1, the second bonding pad 340 is a component similar to the bonding pad 140 illustrated in FIG. 1, the second via insulating layer 361 is a similar component to the via insulating layer 161 illustrated in FIG. 1, and thus, detailed descriptions thereof are omitted as redundant. The second semiconductor chip 300 may further include a front pad insulating layer 373 on the second wiring structure 350, and a front bonding pad 371 embedded in the front pad insulating layer 373 and electrically connected to the second wiring structure 350. The front bonding pad 371 may include a conductive core layer 3711 and a conductive seed layer 3713 on the conductive core layer 3711. The uppermost second semiconductor chip 300 among the plurality of second semiconductor chips 300 may not include the front pad insulating layer 373 and the front bonding pad 371. In the semiconductor package 1000, each of the plurality of second semiconductor chips 300 may be arranged such that the active surface 319 of the second semiconductor substrate 310 faces upward and the inactive surface 317 of the second semiconductor substrate 310 faces downward.

In exemplary embodiments, at least one of the first semiconductor chip 200 and the plurality of second semiconductor chips 300 may be a memory semiconductor chip. In exemplary embodiments, at least one of the first semiconductor chip 200 and the plurality of second semiconductor chips 300 may be a central processing unit (CPU) chip, a graphics processing unit (GPU) chip, or an application processor (AP) chip.

In exemplary embodiments, the semiconductor package 1000 including the first semiconductor chip 200 and the plurality of second semiconductor chips 300 may be referred to as a high-bandwidth memory (HBM) dynamic random-access memory (DRAM) semiconductor chip. For example, the first semiconductor chip 200 may be a buffer chip including a serial-parallel conversion circuit and configured to control the plurality of second semiconductor chips 300, and the plurality of second semiconductor chips 300 may be core chips including DRAM memory cells. In exemplary embodiments, the first semiconductor chip 200 may be referred to as a master chip, and each of the plurality of second semiconductor chips 300 may be referred to as a slave chip.

As illustrated in FIG. 6A, the first semiconductor chip 200 and the lowermost second semiconductor chip 300 may be bonded to each other in a direct bonding manner. The first through electrode 230 of the first semiconductor chip 200 and the second through electrode 330 of the lowermost second semiconductor chip 300 may be aligned with and bonded with each other in the vertical direction (e.g., the Z direction). In addition, the first bonding pad 240 of the first semiconductor chip 200 and the second bonding pad 340 of the lowermost second semiconductor chip 300 may be aligned with and bonded with each other in the vertical direction (e.g., the Z direction). For example, the bonding between the first semiconductor chip 200 and the lowermost second semiconductor chip 300 may be realized by applying heat when the lowermost second semiconductor chip 300 is positioned on the first semiconductor chip 200 such that the bonding surface of the first semiconductor chip 200 and the bonding surface of the lowermost second semiconductor chip 300 are in contact with each other, so as to bond the first through electrode 230 and the first bonding pad 240 of the first semiconductor chip 200 to the second through electrode 330 and the second bonding pad 340 of the lowermost second semiconductor chip 300.

Also, as illustrated in FIG. 6B, two adjacent second semiconductor chips 300 may be bonded to each other in a direct bonding manner. The front bonding pad 371 of the lower second semiconductor chip 300 among the two adjacent second semiconductor chips 300 may be aligned with and bonded to the second through electrode 330 and the second bonding pad 340 of the upper second semiconductor chip 300 among the two adjacent second semiconductor chips 300, in the vertical direction (e.g., the Z direction). For example, the bonding between the two adjacent second semiconductor chips 300 may be realized by applying heat when the upper second semiconductor chip 300 among the two adjacent second semiconductor chips 300 is positioned on the lower second semiconductor chip 300 among the two adjacent second semiconductor chips 300 such that the bonding surface of the lower second semiconductor chip 300 and the bonding surface of the upper second semiconductor chip 300 are in contact with each other, so as to bond the front bonding pad 371 of the lower second semiconductor chip 300 to the second through electrode 330 and the second bonding pad 340 of the upper second semiconductor chip 300.

The semiconductor package 1000 may further include a molding layer 810, which is on the first semiconductor chip 200 and covers side surfaces of the plurality of second semiconductor chips 300. The molding layer 810 may cover a portion of the upper surface of the first semiconductor chip 200, which is not covered by the plurality of second semiconductor chips 300. In exemplary embodiments, the molding layer 810 may not cover the upper surface of the uppermost second semiconductor chip 300. In other exemplary embodiments, the molding layer 810 may be formed to further cover the upper surface of the uppermost second semiconductor chip 300 among the plurality of second semiconductor chips 300. The molding layer 810 may include, for example, an epoxy mold compound (EMC).

Figure 7:
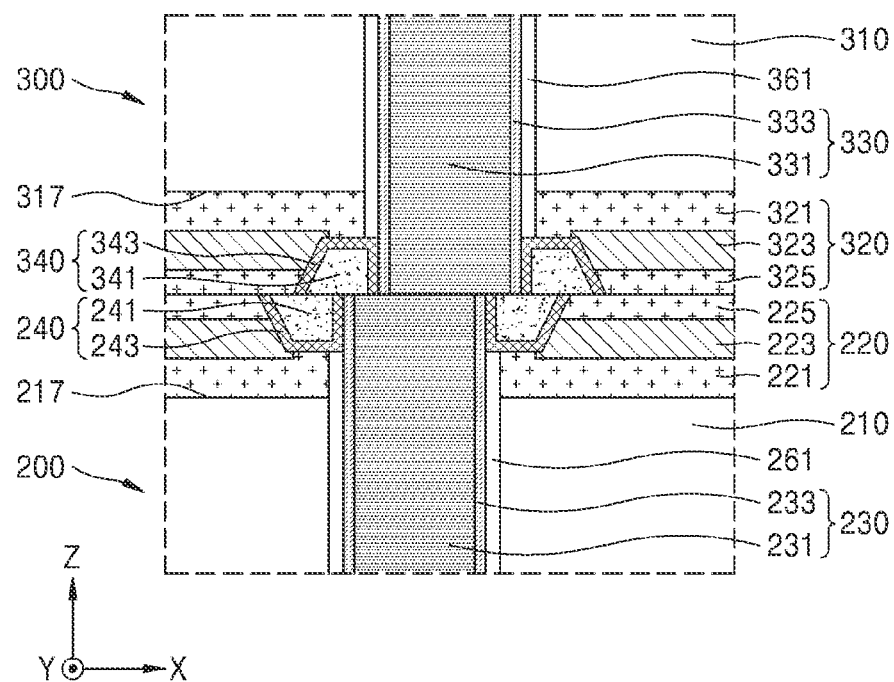
FIG. 7 is a cross-sectional view illustrating a portion of a semiconductor package according to exemplary embodiments of the inventive concept.

FIG. 7 is a cross-sectional view illustrating a portion of the semiconductor package according to exemplary embodiments of the inventive concept. FIG. 7 illustrates the portion of the semiconductor package corresponding to the region "VIA" in FIG. 5.

Referring to FIG. 7, the center of the first through electrode 230 may be misaligned with the center of the second through electrode 330. That is, the center of the upper surface of the first through electrode 230 and the center of the lower surface of the second through electrode 330 may be spaced apart from each other in the horizontal direction (e.g., the X direction and/or the Y direction). For example, the first through electrode 230 may be in contact with the second through electrode 330 and the second bonding pad 340, and the first bonding pad 240 may be in contact with the second through electrode 330 and the second bonding pad 340.

Figure 8:
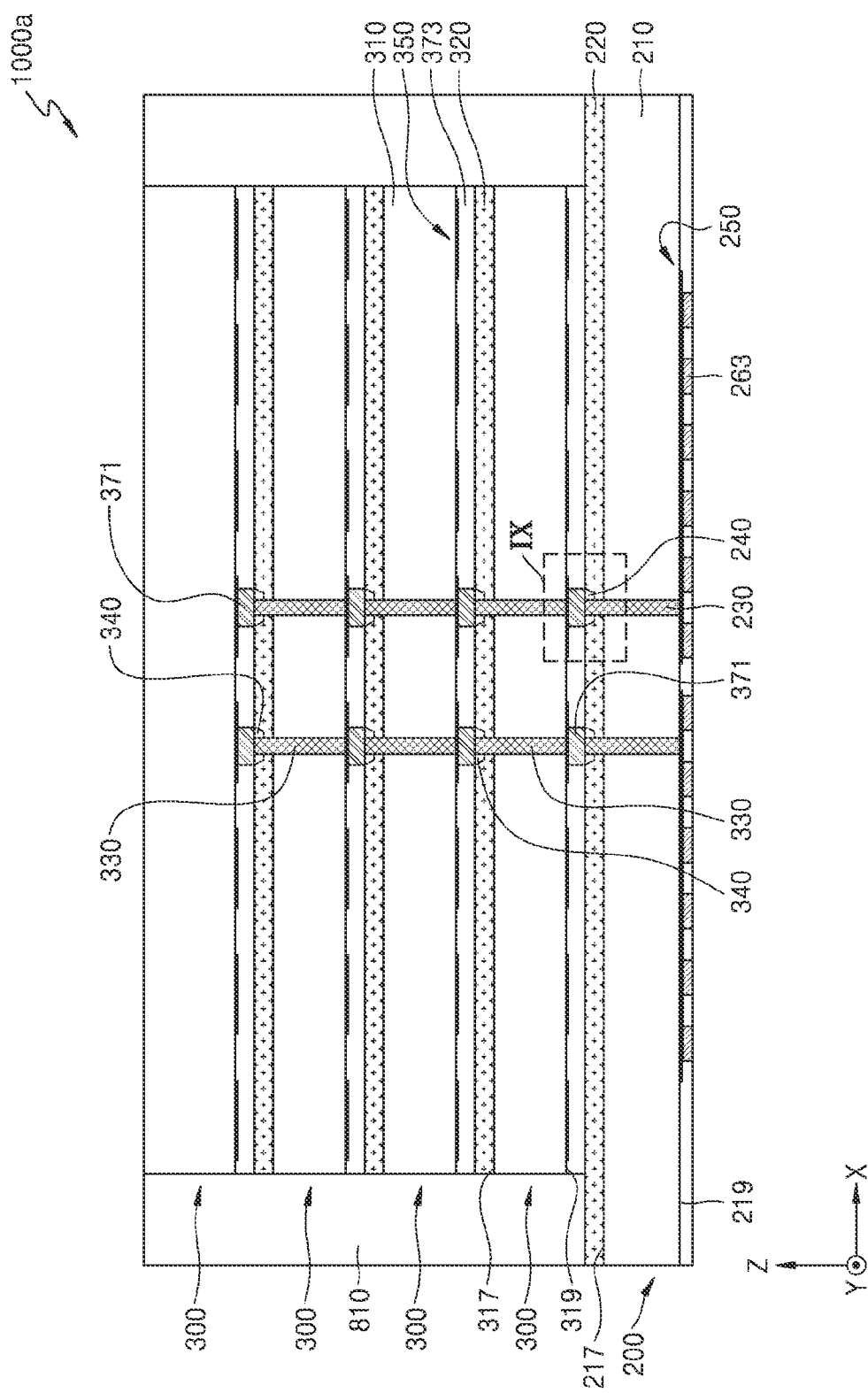
FIG. 8 is a cross-sectional view illustrating a semiconductor package according to exemplary embodiments of the inventive concept.
Figure 9:
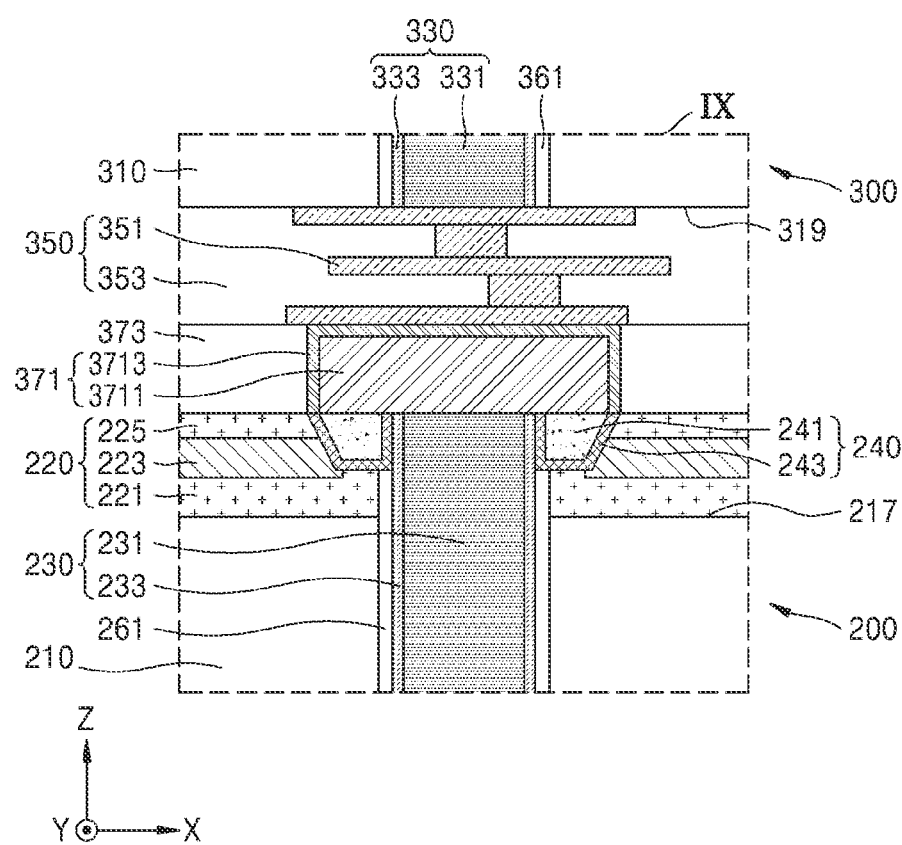
FIG. 9 is an enlarged view illustrating a region "IX" in FIG. 8.

FIG. 8 is a cross-sectional view illustrating a semiconductor package 1000a according to exemplary embodiments of the inventive concept. FIG. 9 is an enlarged view illustrating a region "IX" in FIG. 8. Hereinafter, differences from the semiconductor package 1000 described with reference to FIG. 5 are described in detail.

Referring to FIGS. 8 and 9, the semiconductor package 1000a may include the first semiconductor chip 200 and the plurality of second semiconductor chips 300. In the semiconductor package 1000a, each of the plurality of second semiconductor chips 300 may be arranged such that the inactive surface 317 of the second semiconductor substrate 310 faces upward and the active surface 319 of the second semiconductor substrate 310 faces downward. In exemplary embodiments, the uppermost second semiconductor chip 300 among the plurality of second semiconductor chips 300 may include the front pad insulating layer 373 and the front bonding pad 371 on the active surface 319 of the second semiconductor substrate 310, but may omit the second through electrode 330.

As illustrated in FIG. 9, the first semiconductor chip 200 and the lowermost second semiconductor chip 300 may be bonded to each other in a direct bonding manner. The first through electrode 230 and the first bonding pad 240 of the first semiconductor chip 200 and the front bonding pad 371 of the lowermost second semiconductor chip 300 may be aligned with and bonded to each other in the vertical direction (e.g., the Z direction). For example, the bonding between the first semiconductor chip 200 and the lowermost second semiconductor chip 300 may be realized by applying heat when the lowermost second semiconductor chip 300 is positioned on the first semiconductor chip 200 such that the bonding surface of the first semiconductor chip 200 and the bonding surface of the lowermost second semiconductor chip 300 are in contact with each other, so as to bond the first through electrode 230 and the first bonding pad 240 of the first semiconductor chip 200 to the front bonding pad 371 of the lowermost second semiconductor chip 300.

Figure 10:
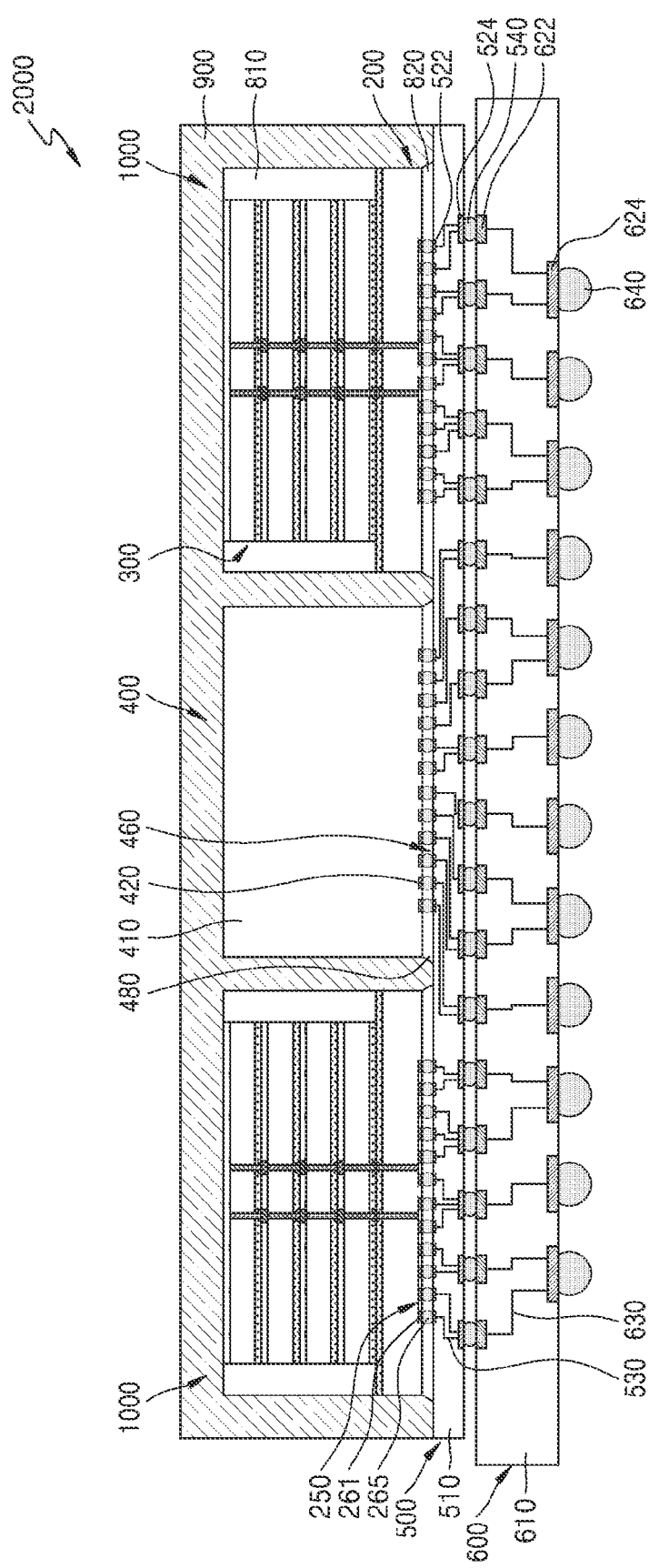
FIG. 10 is a cross-sectional view illustrating a semiconductor package according to exemplary embodiments of the inventive concept.

FIG. 10 is a cross-sectional view illustrating a semiconductor package 2000 according to exemplary embodiments of the inventive concept.

Referring to FIG. 10, the semiconductor package 2000 may include a main board 600 with an interposer 500 mounted thereon, at least one sub-semiconductor package 1000 attached to the interposer 500 and including the first semiconductor chip 200 and the plurality of second semiconductor chips 300, and a third semiconductor chip 400. FIG. 10 illustrates that the sub-semiconductor package 1000 corresponds to the semiconductor package 1000 illustrated in FIG. 5. However, the sub-semiconductor package 1000 may be the semiconductor package 1000a illustrated in FIG. 8. The sub-semiconductor package 1000 will be described with reference to FIG. 5. Also, the semiconductor package 2000 may be referred to as a system.

The sub-semiconductor package 1000 may be attached to the interposer 500 through a plurality of first connection bumps 265. The plurality of first connection bumps 265 may be attached to the plurality of first connection pads 263 to be electrically connected to the first wiring structure 250 of the first semiconductor chip 200. The plurality of first connection bumps 265 may provide at least one of a signal, power, and ground for the sub-semiconductor package 1000.

Although FIG. 10 illustrates that the semiconductor package 2000 includes two sub-semiconductor packages 1000, the inventive concept is not limited thereto. For example, the semiconductor package 2000 may include one sub-semiconductor package 1000 or three or more sub-semiconductor packages 1000.

The third semiconductor chip 400 may include a third semiconductor substrate 410 having a semiconductor device formed on the active surface thereof, and a plurality of connection pads 420. In exemplary embodiments, each of the plurality of connection pads 420 may include at least one of aluminum, copper, and nickel. The third semiconductor chip 400 may be attached to the interposer 500 through a plurality of second connection bumps 460. The plurality of second connection bumps 460 may be attached to the plurality of connection pads 420. The third semiconductor chip 400 may be, for example, a CPU chip, a GPU chip, or an AP chip.

The third semiconductor substrate 410 is a component substantially similar to the first semiconductor substrate 210 or the second semiconductor substrate 310 illustrated in FIG. 5, and the second connection bump 460 is a component similar to the first connection bump 265, and thus detailed descriptions thereof are omitted as redundant.

The interposer 500 may include a base layer 510, a plurality of first upper surface pads 522 and a plurality of first lower surface pads 524 respectively on the upper surface and the lower surface of the base layer 510, and a plurality of first wiring paths 530 electrically connecting the plurality of first upper surface pad 522 to the plurality of first lower surface pad 524 through the base layer 510. The base layer 510 may include a semiconductor, glass, ceramic, or plastic. For example, the base layer 510 may include silicon. The plurality of first wiring paths 530 may be a wiring layer connected, on the upper surface and/or lower surface of the base layer 510, to the plurality of first upper surface pads 522 and/or the plurality of first lower surface pads 524, and/or may be internal through electrodes electrically connecting, within the base layer 510, the plurality of first upper surface pads 522 to the plurality of first lower surface pads 524. The plurality of first connection bumps 265 electrically connecting the sub-semiconductor packages 1000 to the interposer 500, and the plurality of second connection bumps 460 electrically connecting the third semiconductor chip 400 to the interposer 500 may be connected to the plurality of first upper surface pads 522.

A first underfill layer 820 may be disposed between the sub-semiconductor package 1000 and the interposer 500, and a second underfill layer 480 may be disposed between the third semiconductor chip 400 and the interposer 500. The first underfill layer 820 may surround the plurality of first connection bumps 265, and the second underfill layer 480 may surround the plurality of second connection bumps 460.

The semiconductor package 2000 may further include a package molding layer 900 on the interposer 500 surrounding the sub-semiconductor packages 1000 and side surfaces of the third semiconductor chip 400. The package molding layer 900 may include, for example, an EMC. In exemplary embodiments, the package molding layer 900 may cover the upper surfaces of the sub-semiconductor packages 1000 and the third semiconductor chip 400. In other exemplary embodiments, the package molding layer 900 may not cover the upper surfaces of the sub-semiconductor packages 1000 and the third semiconductor chip 400. For example, a heat dissipation member may be attached to the sub-semiconductor packages 1000 and the third semiconductor chip 400 with a thermal interface material (TIM) disposed therebetween.

A plurality of board connection terminals 540 may be attached to the plurality of first lower surface pads 524. The plurality of board connection terminals 540 may electrically connect the interposer 500 to the main board 600.

The main board 600 may include a base board layer 610, a plurality of second upper surface pads 622 and a plurality of second lower surface pads 624 respectively on the upper surface and the lower surface of the base board layer 610, and a plurality of second wiring paths 630 electrically connecting the plurality of second upper surface pads 622 to the plurality of second lower surface pads 624 through the base board layer 610.

In exemplary embodiments, the main board 600 may be a printed circuit board. For example, the main board 600 may be a multi-layer printed circuit board. The base board layer 610 may be made of at least one material selected from phenol resin, epoxy resin, and polyimide.

Solder resist layers (not shown) respectively exposing the plurality of second upper surface pads 622 and the plurality of second lower surface pads 624 may be formed on the upper surface and the lower surface of the base board layer 610, respectively. The plurality of board connection terminals 540 may be connected to the plurality of second upper surface pads 622, and a plurality of external connection terminals 640 may be connected to the plurality of second lower surface pads 624. The plurality of board connection terminals 540 may electrically connect the plurality of first lower surface pads 524 to the plurality of second upper surface pads 622. The plurality of external connection terminals 640 connected to the plurality of second lower surface pads 624 may connect the semiconductor package 2000 to the outside.

In exemplary embodiments, the semiconductor package 2000 may not include the main board 600, and the plurality of board connection terminals 540 of the interposer 500 may function as external connection terminals.

Figure 11:
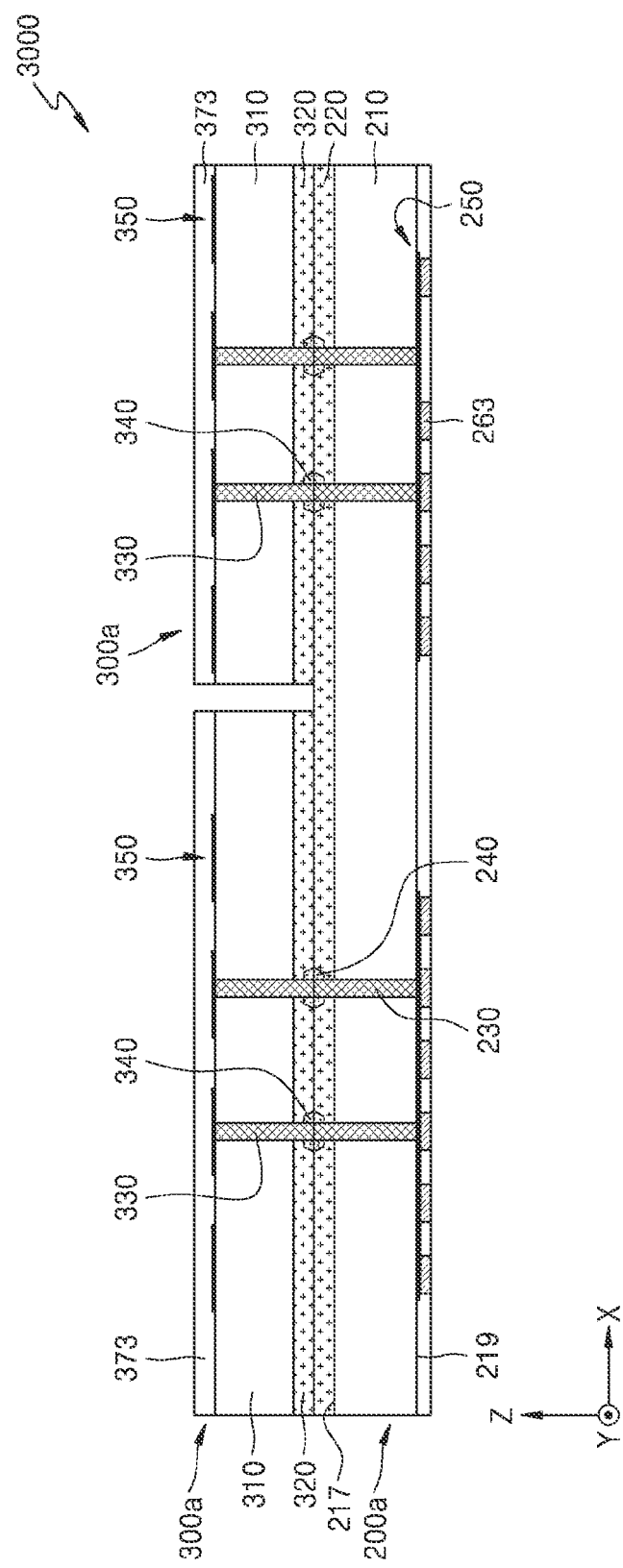
FIG. 11 is a cross-sectional view illustrating a semiconductor package according to exemplary embodiments of the inventive concept.

FIG. 11 is a cross-sectional view illustrating a semiconductor package 3000 according to exemplary embodiments of the inventive concept. Hereinafter, descriptions as those given above are omitted as redundant.

Referring to FIG. 11, the semiconductor package 3000 may include a first semiconductor chip 200a and a plurality of second semiconductor chips 300a. The plurality of second semiconductor chips 300a may be stacked on the first semiconductor chip 200a and may be arranged side-by-side on the upper surface of the first semiconductor chip 200a. Although FIG. 11 illustrates that two second semiconductor chips 300a are stacked on the first semiconductor chip 200a, three or more second semiconductor chips 300a may be arranged side-by-side on the first semiconductor chip 200a. In other exemplary embodiments, the semiconductor package 3000 may include one or more second semiconductor chips 300a stacked on two or more first semiconductor chips 200a. In exemplary embodiments, all of the plurality of second semiconductor chips 300a may be of the same type of semiconductor chip. In exemplary embodiments, the plurality of second semiconductor chips 300a may include different types of semiconductor chips. Each of the plurality of second semiconductor chips 300a and the first semiconductor chip 200a may be bonded to each other in a direct bonding manner. The bonding between each of the plurality of second semiconductor chips 300a and the first semiconductor chip 200a is similar to the bonding between the first semiconductor chip 200 and the lowermost second semiconductor chip 300 of FIG. 5, and thus, a detailed description thereof is omitted as redundant.

Figure 12:
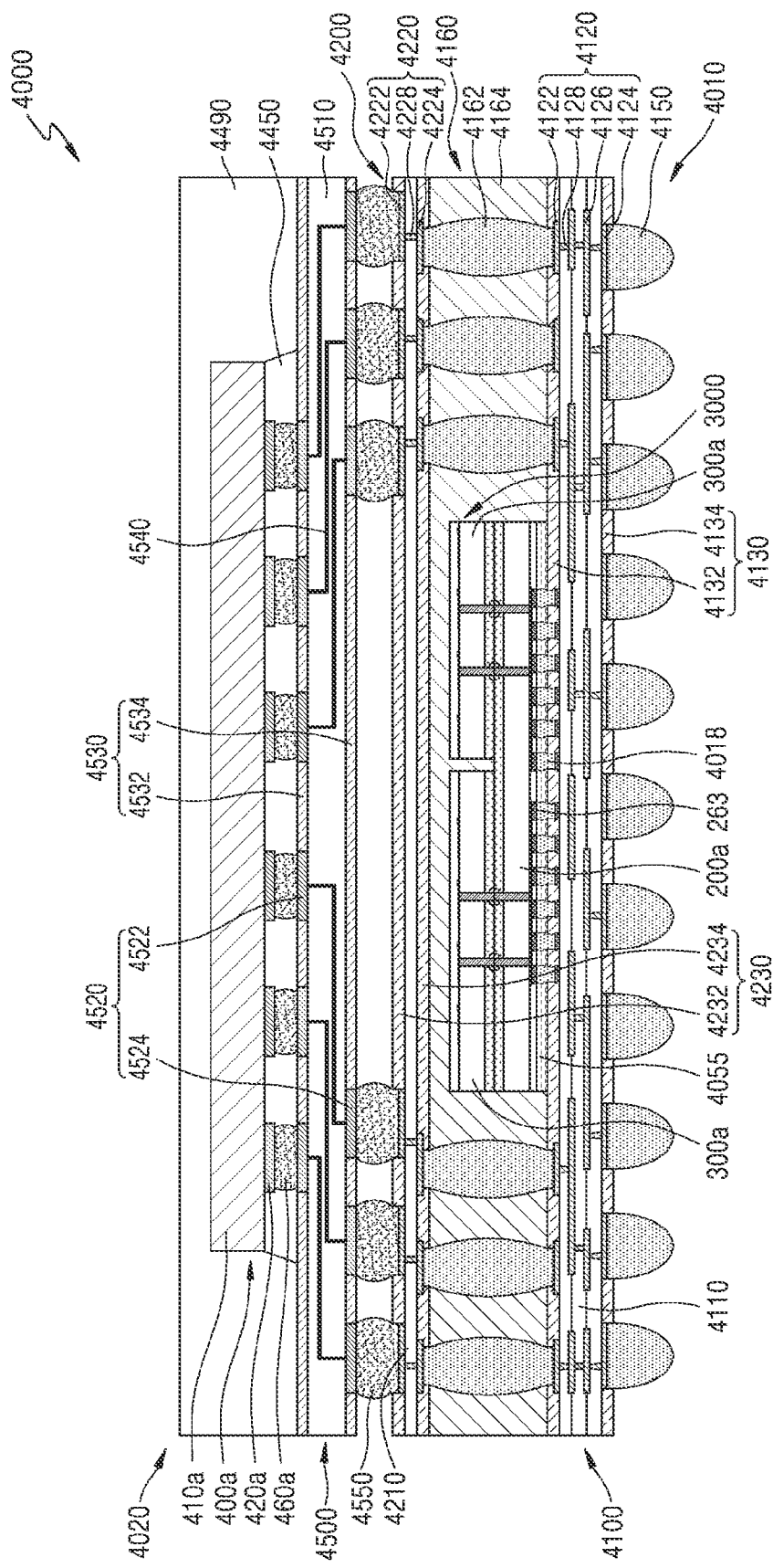
FIG. 12 is a cross-sectional view illustrating a semiconductor package according to exemplary embodiments of the inventive concept.

FIG. 12 is a cross-sectional view illustrating a semiconductor package 4000 according to exemplary embodiments of the inventive concept.

Referring to FIG. 12, the semiconductor package 4000 includes an upper semiconductor package 4020 stacked on a lower semiconductor package 4010. The semiconductor package 4000 may have a package-on-package structure.

The lower semiconductor package 4010 may include a support wiring structure 4100, an expanded layer 4160 on the support wiring structure 4100, a sub-semiconductor package 3000 in the expanded layer 4160, and a cover wiring structure 4200 on the expanded layer 4160. The sub-semiconductor package 3000 may be the semiconductor package 3000 illustrated in FIG. 11.

The lower semiconductor package 4010 may be a fan-out semiconductor package in which the horizontal width and the planar area of the support wiring structure 4100 and the horizontal width and the planar area of the cover wiring structure 4200 are greater than the horizontal width and the planar area of the sub-semiconductor package 3000, respectively. In exemplary embodiments, the horizontal widths and the planar areas of the support wiring structure 4100 and the cover wiring structure 4200 may be equal to each other, respectively. In exemplary embodiments, corresponding side surfaces of the support wiring structure 4100, the expanded layer 4160, and the cover wiring structure 4200 may be coplanar with each other.

The support wiring structure 4100 may be referred to as a lower wiring structure, and the cover wiring structure 4200 may be referred to as an upper wiring structure.

The support wiring structure 4100 and the cover wiring structure 4200 may be, for example, printed circuit boards, ceramic substrates, wafers for fabricating a package, or interposers. In exemplary embodiments, the support wiring structure 4100 and the cover wiring structure 4200 may be multi-layer printed circuit boards. In the case where the support wiring structure 4100 is a printed circuit board, the supporting wiring structure 4100 may also be referred to as a support printed circuit board, a lower printed circuit board, or a first printed circuit board. In the case where the cover wiring structure 4200 is a printed circuit board, the cover wiring structure 4200 may also be referred to as a cover printed circuit board, an upper printed circuit board, or a second printed circuit board.

The support wiring structure 4100 may include at least one first base insulating layer 4110 and a plurality of first wiring patterns 4120. The cover wiring structure 4200 may include at least one second base insulating layer 4210 and a plurality of second wiring patterns 4220. The first base insulating layer 4110 and the second base insulating layer 4210 may include at least one material selected from phenol resin, epoxy resin, and polyimide.

The plurality of first wiring patterns 4120 may include a first upper surface wiring pattern, which is on the upper surface of the at least one first base insulating layer 4110 and includes a plurality of first upper surface pads 4122, a first lower surface wiring pattern, which is on the lower surface of the at least one first base insulating layer 4110 and includes a plurality of first lower surface pads 4124, and a plurality of first conductive vias 4128, which penetrate the at least one first base insulating layer 4110 and electrically connect the first wiring patterns 4120 in different wiring layers to each other. In exemplary embodiments, in the case where the support wiring structure 4100 includes a plurality of first base insulating layers 4110, the first wiring pattern 4120 may further include a first internal wiring pattern 4126 that forms a wiring layer between two adjacent first base insulating layers 4110.

The plurality of second wiring patterns 4220 may include a second upper surface wiring pattern, which is on the upper surface of the at least one second base insulating layer 4210 and includes a plurality of second upper surface pads 4222, a second lower surface wiring pattern, which is on the lower surface of the at least one second base insulating layer 4210 and includes a plurality of second lower surface pads 4224, and a plurality of second conductive vias 4228, which penetrate the at least one second base insulating layer 4210 and electrically connect the second wiring patterns 4220 in different wiring layers to each other. The first wiring pattern 4120 and the second wiring pattern 4220 may include copper, nickel, stainless steel, or beryllium copper.

The support wiring structure 4100 may further include first solder resist layers 4130 respectively on the upper and lower surfaces thereof. The first solder resist layers 4130 may include a first upper surface solder resist layer 4132 covering the upper surface of the at least one first base insulating layer 4110 and exposing the first upper surface pad 4122, and a first lower surface solder resist layer 4134 covering the lower surface of the at least one first base insulating layer 4110 and exposing the first lower surface pad 4124. In exemplary embodiments, the first lower surface solder resist layer 4134 may be formed, but the first upper surface solder resist layer 4132 may be omitted.

The cover wiring structure 4200 may further include second solder resist layers 4230 respectively on the upper and lower surfaces thereof. The second solder resist layers 4230 may include a second upper surface solder resist layer 4232 covering the upper surface of the at least one second base insulating layer 4210 and exposing the second upper surface pad 4222 of the second upper surface wiring pattern, and a second lower surface solder resist layer 4234 covering the lower surface of the at least one second base insulating layer 4210 and exposing the second lower surface pad 4224 of the second lower surface wiring pattern.

A plurality of first chip connection terminals 4018 may be disposed between the plurality of first upper surface pads 4122 and the plurality of first connection pads 263, to electrically connect the sub-semiconductor package 3000 to the support wiring structure 4100. For example, the plurality of first chip connection terminals 4018 may be solder balls or bumps. In exemplary embodiments, an underfill layer 4055 surrounding the plurality of first chip connection terminals 4018 may be disposed between the sub-semiconductor package 3000 and the support wiring structure 4100. In exemplary embodiments, the underfill layer 4055 may be a non-conductive film (NCF).

The semiconductor package 4000 may include a plurality of external connection terminals 4150 attached to the plurality of first lower surface pads 4124. For example, the height of each of the plurality of external connection terminals 4150 may be about 150 μm. For example, the plurality of external connection terminals 4150 may be solder balls.

The expanded layer 4160 may include a plurality of connection structures 4162, and a filling member 4164 surrounding the plurality of connection structures 4162 and the sub-semiconductor package 3000. The filling member 4164 may fill a space between the support wiring structure 4100 and the cover wiring structure 4200 and surround the sub-semiconductor package 3000. The plurality of connection structures 4162 may be spaced apart from the sub-semiconductor package 3000 and may be around the sub-semiconductor package 3000. The plurality of connection structures 4162 may penetrate the filling member 4164 to electrically connect the support wiring structure 4100 to the cover wiring structure 4200. The upper and lower ends of each of the plurality of connection structures 4162 may be in contact with and connected to any one of the plurality of second lower surface pads 4224 of the cover wiring structure 4200, and any one of the plurality of first upper surface pads 4122 of the support wiring structure 4100.

The upper semiconductor package 4020 may include at least one third semiconductor chip 400*a*. The upper semiconductor package 4020 may be electrically connected to the lower semiconductor package 4010 through a plurality of package connection terminals 4550 attached to the plurality of second upper surface pads 4222 of the lower semiconductor package 4010.

The third semiconductor chip 400*a* may include a third semiconductor substrate 410*a* having a semiconductor device formed on the active surface thereof, and a plurality of chip connection pads 420*a* on the active surface of the third semiconductor substrate 410*a*. The at least one third semiconductor chip 400*a* may be a memory semiconductor chip.

Although FIG. 12 illustrates that the at least one third semiconductor chip 400*a* included in the upper semiconductor package 4020 is mounted on a package base substrate 4500 in a flip-chip manner, this is merely exemplary and the inventive concept is not limited thereto. The semiconductor package 4000 may include, as an upper semiconductor package, any type of semiconductor package including the at least one third semiconductor chip 400*a*, and to the lower side of which the package connection terminal 4550 may be attached to electrically connect the semiconductor package 4000 to the lower semiconductor package 4010.

The package base substrate 4500 may include a base board layer 4510 and a plurality of board pads 4520 on the upper and lower surfaces of the base board layer 4510. The plurality of board pads 4520 may include a plurality of board upper surface pads 4522 on the upper surface of the base board layer 4510 and a plurality of board lower surface pads 4524 on the lower surface of the base board layer 4510. In exemplary embodiments, the package base substrate 4500 may be a printed circuit board. Board solder resist layers 4530 exposing the plurality of board pads 4520 may be formed on the upper and lower surfaces of the base board layer 4510. The board solder resist layers 4530 may include an upper surface board solder resist layer 4532 covering the upper surface of the base board layer 4510 and exposing the plurality of board upper surface pads 4522, and a lower surface board solder resist layer 4534 covering the lower surface of the base board layer 4510 and exposing the plurality of board lower surface pads 4524.

The package base substrate 4500 may include board wirings 4540 electrically connecting, within the base board layer 4510, the plurality of board upper surface pads 4522 to the plurality of board lower surface pads 4524. The board wiring 4540 may include a board wiring line and a board wiring via.

The plurality of board upper surface pads 4522 may be electrically connected to the third semiconductor chip 400*a*.

For example, a plurality of second chip connection terminals 460a may be disposed between the plurality of chip connection pads 420a of the third semiconductor chip 400a and the plurality of board upper surface pads 4522 of the package base substrate 4500, to electrically connect the third semiconductor chip 400a to the package base substrate 4500. In exemplary embodiments, a second underfill layer 4450 surrounding the plurality of second chip connection terminals 460a may be disposed between the third semiconductor chip 400a and the package base substrate 4500. The second underfill layer 4450 may include, for example, epoxy resin formed by a capillary underfill method.

A molding layer 4490 surrounding the third semiconductor chip 400a may be on the package base substrate 4500. The molding layer 4490 may include, for example, an EMC.

Figure 13:
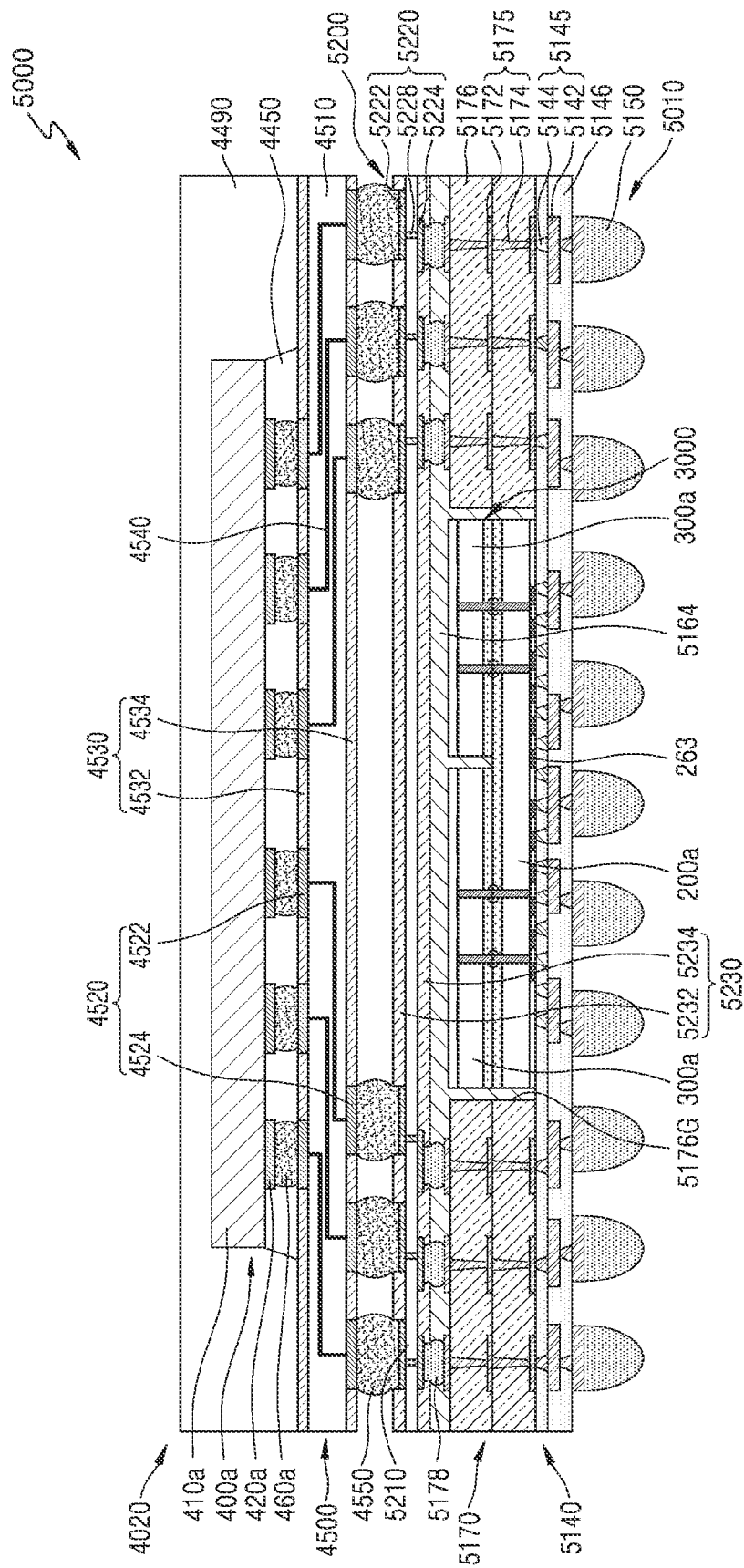
FIG. 13 is a cross-sectional view illustrating a semiconductor package according to exemplary embodiments of the inventive concept.

FIG. 13 is a cross-sectional view illustrating a semiconductor package 5000 according to exemplary embodiments of the inventive concept.

Referring to FIG. 13, the semiconductor package 5000 includes the upper semiconductor package 4020 stacked on a lower semiconductor package 5010. The upper semiconductor package 4020 is substantially the same as the upper semiconductor package 4020 described with reference to FIG. 12, and thus, a detailed descriptions thereof are omitted as redundant.

The lower semiconductor package 5010 may include a support wiring structure 5140, an expanded layer 5170 on the support wiring structure 5140 and having a mounting space 5176G therein, the sub-semiconductor package 3000 in the mounting space 5176G of the expanded layer 5170, and a cover wiring structure 5200 on the expanded layer 5170. The expanded layer 5170 may surround the sub-semiconductor package 3000. The sub-semiconductor package 3000 may be the semiconductor package 3000 illustrated in FIG. 11.

The lower semiconductor package 5010 may be a fan-out semiconductor package. In exemplary embodiments, the expanded layer 5170 may be a panel board, and the lower semiconductor package 5010 may be a fan-out panel level package (FOPLP). For example, the lower semiconductor package 5010 may be a chip-first FOPLP formed by attaching the cover wiring structure 5200 on the expanded layer 5170 and then forming the support wiring structure 5140. The support wiring structure 5140 may be referred to as a redistribution layer.

In exemplary embodiments, the horizontal width and the planar area of the mounting space 5176G may be greater than the horizontal width and the planar area of a footprint constituted by the sub-semiconductor package 3000. The side surfaces of the sub-semiconductor package 3000 may be spaced apart from an inner surface of the mounting space 5176G.

The support wiring structure 5140 may include a redistribution conductive structure 5145 and a plurality of redistribution insulating layers 5146. The redistribution conductive structure 5145 and the redistribution insulating layer 5146 may be referred to as a wiring pattern and a base insulating layer, respectively. The redistribution conductive structure 5145 may include a plurality of redistribution line patterns 5142 on at least one of the upper and lower surfaces of each of the plurality of redistribution insulating layers 5146, and a plurality of redistribution vias 5144 penetrating at least one of the plurality of redistribution insulating layers 5146 to be in contact with and connected to some of the plurality of redistribution line patterns 5142, respectively. In exemplary embodiments, at least some of the plurality of redistribution line patterns 5142 may be formed together with some of the plurality of redistribution vias 5144 to constitute one body. In exemplary embodiments, the plurality of redistribution vias 5144 may have a tapered shape, such that the horizontal width thereof narrows from the lower side to the upper side. That is, the horizontal width of the upper end, which is adjacent to the first semiconductor chip 200a, of each of the plurality of redistribution vias 5144 may be smaller than that of the lower end. The plurality of first connection pads 263 of the sub-semiconductor package 3000 may be electrically connected to the redistribution conductive structure 5145.

The expanded layer 5170 may be, for example, a printed circuit board, a ceramic substrate, a wafer for fabricating a package, or an interposer. In exemplary embodiments, the expanded layer 5170 may be a multi-layer printed circuit board. The mounting space 5176G may be formed as an opening or a cavity in the expanded layer 5170. The mounting space 5176G may be formed in a partial region of the expanded layer 5170, for example, a central region. The mounting space 5176G may be recessed from the upper surface of the expanded layer 5170 to a preset depth or may extend from the upper surface to the lower surface of the expanded layer 5170 to be opened. The expanded layer 5170 may include a plurality of connection structures 5175 and at least one substrate base 5176. The connection structure 5175 may include a connection wiring pattern 5172 and a connection conductive via 5174.

The lower semiconductor package 5010 may further include a filling member 5164 filling a space between the sub-semiconductor package 3000 and the expanded layer 5170 and a space between the expanded layer 5170 and the cover wiring structure 5200. The filling member 5164 may surround the sub-semiconductor package 3000. The filling member 5164 may include, for example, an EMC.

The cover wiring structure 5200 including a plurality of second wiring patterns 5220 electrically connected to the connection structure 5175 is on the expanded layer 5170. The cover wiring structure 5200 may include at least one second base insulating layer 5210 and a plurality of second wiring patterns 5220. The plurality of second wiring patterns 5220 may include a second upper surface wiring pattern, which is on the upper surface of the at least one second base insulating layer 5210 and includes a plurality of second upper surface pads 5222, a second lower surface wiring pattern, which is on the lower surface of the at least one second base insulating layer 5210 and includes a plurality of second lower surface pads 5224, and a plurality of second conductive vias 5228, which penetrate the at least one second base insulating layer 5210 and electrically connect the second wiring patterns 5220 in different wiring layers. In exemplary embodiments, a plurality of internal connection terminals 5178 may be between the connection structure 5175 and the plurality of second lower surface pads 5224 to electrically connect the connection structure 5175 to the second wiring pattern 5220.

While the inventive concept has been particularly shown and described with reference to embodiments thereof, it will be understood that various changes and modifications in form and details may be made therein without departing from the spirit and scope of the following claims.

What is claimed is:
1. A semiconductor chip comprising:
 a semiconductor substrate;
 a pad insulating layer on the semiconductor substrate;
 a through electrode which penetrates the semiconductor substrate and the pad insulating layer and comprises a conductive plug and a conductive barrier layer surrounding a sidewall of the conductive plug;
a via insulating layer partially covering a sidewall of the through electrode; and
a bonding pad which surrounds the sidewall of the through electrode and is spaced apart from the conductive plug with the conductive barrier layer disposed therebetween,
wherein the bonding pad extends from an upper end of the through electrode to the via insulating layer along the conductive barrier layer.

2. The semiconductor chip of claim 1, wherein the bonding pad is in contact with the conductive barrier layer and extends downward from the upper end of the through electrode along the conductive barrier layer.

3. The semiconductor chip of claim 1, wherein the bonding pad comprises:
a conductive core layer; and
a conductive seed layer which covers a portion of a surface of the conductive core layer and is in contact with the conductive core layer and the conductive barrier layer.

4. The semiconductor chip of claim 3, wherein the conductive seed layer comprises:
a first portion between an inner circumferential surface of the conductive core layer and the conductive barrier layer;
a second portion between an outer circumferential surface of the conductive core layer and the pad insulating layer; and
a third portion between a bottom surface of the conductive core layer and the pad insulating layer.

5. The semiconductor chip of claim 3, wherein a grain size of the conductive plug material is greater than a grain size of the conductive core layer material.

6. The semiconductor chip of claim 3, wherein the conductive plug and the conductive core layer comprise copper.

7. The semiconductor chip of claim 1, wherein the bonding pad is embedded in a recess of the pad insulating layer, and an upper surface of the through electrode and an upper surface of the bonding pad are connected to each other.

8. The semiconductor chip of claim 7, wherein a distance between an inner circumference and an outer circumference of the upper surface of the bonding pad is about 0.5 to about 10 times a horizontal width of the upper surface of the through electrode.

9. The semiconductor chip of claim 1, wherein a vertical height of the bonding pad is about 1 μm to about 10 μm.

10. The semiconductor chip of claim 1, wherein the pad insulating layer comprises:
a first insulating layer which is on the semiconductor substrate and comprises silicon oxide;
a second insulating layer which is on the first insulating layer and comprises silicon nitride; and
a third insulating layer which is on the second insulating layer and comprises silicon oxide.

11. A semiconductor chip comprising:
a semiconductor substrate comprising a first surface and a second surface, which are opposite to each other;
a pad insulating layer on the first surface of the semiconductor substrate;
a through electrode which penetrates the semiconductor substrate and the pad insulating layer and comprises a conductive plug and a conductive barrier layer surrounding a sidewall of the conductive plug;
a ring-shaped bonding pad which is provided in a recess of the pad insulating layer and surrounds a sidewall of the through electrode; and a wiring structure comprising a wiring insulating layer on the second surface of the semiconductor substrate, and a conductive wiring pattern which is provided in the wiring insulating layer and is electrically connected to the through electrode,
wherein the bonding pad comprises:
a conductive core layer provided in the recess of the pad insulating layer; and
a conductive seed layer provided between a surface of the pad insulating layer defining the recess and the conductive core layer and between the conductive core layer and the conductive barrier layer.

12. The semiconductor chip of claim 11, further comprising a via insulating layer surrounding a portion of the sidewall of the through electrode, wherein the via insulating layer is in contact with the bonding pad.

13. A semiconductor package comprising a first semiconductor chip and a second semiconductor chip bonded to each other, wherein
the first semiconductor chip comprises:
a first semiconductor substrate comprising a first surface and a second surface, which are opposite to each other;
a first pad insulating layer on the first surface of the first semiconductor substrate;
a first through electrode comprising a first conductive plug penetrating the first semiconductor substrate and the first pad insulating layer, and a first conductive barrier layer surrounding a sidewall of the first conductive plug;
a via insulating layer that partially covers a sidewall of the first through electrode; and
a first bonding pad which surrounds the sidewall of the first through electrode and is spaced apart from the first conductive plug with the first conductive barrier layer disposed therebetween, and the second semiconductor chip comprises a second semiconductor substrate, and a second bonding pad which is in contact with at least one of the first bonding pad and the first through electrode,
wherein the first bonding pad extends from an upper end of the first through electrode to the via insulating layer along the first through electrode.

14. The semiconductor package of claim 13, wherein the second semiconductor chip further comprises:
a second pad insulating layer which is provided on the second semiconductor substrate and comprises a recess in which the second bonding pad is embedded; and
a second through electrode which penetrates the second semiconductor substrate and the second pad insulating layer and is connected to the second pad insulating layer.

15. The semiconductor package of claim 14, wherein the second through electrode is in contact with the first through electrode.

16. The semiconductor package of claim 14, wherein the second through electrode is in contact with the first bonding pad.

17. The semiconductor package of claim 14, wherein the second through electrode comprises a second conductive plug penetrating through the second semiconductor substrate and the second pad insulating layer, and a second conductive barrier layer surrounding a sidewall of the second conductive plug, and
the second bonding pad is spaced apart from the second conductive plug with the second conductive barrier layer disposed therebetween.

18. The semiconductor package of claim 17, wherein the second bonding pad comprises:
   a second conductive core layer provided in the recess of the second pad insulating layer; and
   a second conductive seed layer provided between a surface of the second pad insulating layer defining the recess and the second conductive core layer and disposed between the second conductive core layer and the second conductive barrier layer.

19. The semiconductor package of claim 13, wherein the via insulating layer is in contact with the first bonding pad.

* * * * *